(12) United States Patent
Kim

(10) Patent No.: US 11,942,137 B2
(45) Date of Patent: Mar. 26, 2024

(54) MEMORY CONTROLLER AND MEMORY SYSTEM INCLUDING THE SAME

(71) Applicant: SAMSUNG ELECTRONICS CO., LTD., Suwon-si (KR)

(72) Inventor: Hoyoun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 121 days.

(21) Appl. No.: 17/829,669

(22) Filed: Jun. 1, 2022

(65) Prior Publication Data

US 2023/0143905 A1    May 11, 2023

(30) Foreign Application Priority Data

Nov. 8, 2021  (KR) .................. 10-2021-0152154
Jan. 7, 2022  (KR) .................. 10-2022-0002444

(51) Int. Cl.
| | | |
|---|---|---|
| G11C 11/40 | (2006.01) | |
| G06F 3/06 | (2006.01) | |
| G06N 7/01 | (2023.01) | |
| G11C 11/406 | (2006.01) | |

(52) U.S. Cl.
CPC .......... *G11C 11/406* (2013.01); *G06F 3/0604* (2013.01); *G06F 3/0655* (2013.01); *G06F 3/0679* (2013.01); *G06N 7/01* (2023.01)

(58) Field of Classification Search
CPC ............ G11C 11/40611; G11C 11/408; G11C 11/406; G11C 11/40622; G11C 11/54; G06N 3/045; G06N 7/01; G06N 3/044; G06N 3/08; G06F 3/0604; G06F 3/0679; G06F 3/0655

See application file for complete search history.

(56) References Cited

U.S. PATENT DOCUMENTS

| | | | |
|---|---|---|---|
| 5,559,994 A * | 9/1996 | Ando ................. | G10H 7/02 |
| | | | 84/615 |
| 9,299,400 B2 | 3/2016 | Bains et al. | |
| 9,355,689 B2 | 5/2016 | Jeffrey et al. | |
| 10,304,515 B2 | 5/2019 | Hedden | |
| 10,388,333 B2 | 8/2019 | Penney et al. | |
| 2017/0186481 A1* | 6/2017 | Oh ..................... | G11C 11/406 |
| 2019/0348107 A1* | 11/2019 | Shin ................. | G11C 11/40618 |
| 2020/0043545 A1* | 2/2020 | Gans ................. | G11C 11/40603 |
| 2020/0090729 A1* | 3/2020 | Son .................... | G11C 11/406 |

(Continued)

*Primary Examiner* — Tuan T Nguyen
(74) *Attorney, Agent, or Firm* — Fish & Richardson P.C.

(57) ABSTRACT

A memory controller, to control a semiconductor memory device, includes an access pattern profiler, a row hammer prediction neural network, and a memory interface. The access pattern profiler generates an access pattern profile based on a row access pattern on a portion of memory cell rows of the semiconductor memory device during a reference time interval posterior to a refresh interval during which the memory cell rows are refreshed. The row hammer prediction neural network predicts a probability of occurrence based on the access pattern profile. In response to the probability being equal to or greater than a reference value, the row hammer prediction neural network generates a hammer address, an alert signal indicating that the row hammer occurs, and an outcast row list. The memory interface transmits the hammer address, the outcast row list, and the alert signal to the semiconductor memory device.

20 Claims, 30 Drawing Sheets

(56) References Cited

U.S. PATENT DOCUMENTS

| | | |
|---|---|---|
| 2021/0043248 A1* | 2/2021 | Lee ................. G11C 11/406 |
| 2021/0065775 A1 | 3/2021 | Hush et al. |
| 2021/0264999 A1 | 8/2021 | Bains et al. |
| 2023/0367486 A1* | 11/2023 | Vijendra Kumar Lakshmi .......... G06F 3/0619 |

* cited by examiner

FIG. 4

| ROW_ADDR(RA) | ARID |
|---|---|
| RA1 | ARID1 |
| RA3 | ARID3 |
| RA7 | ARID7 |
| RA8 | ARID8 |

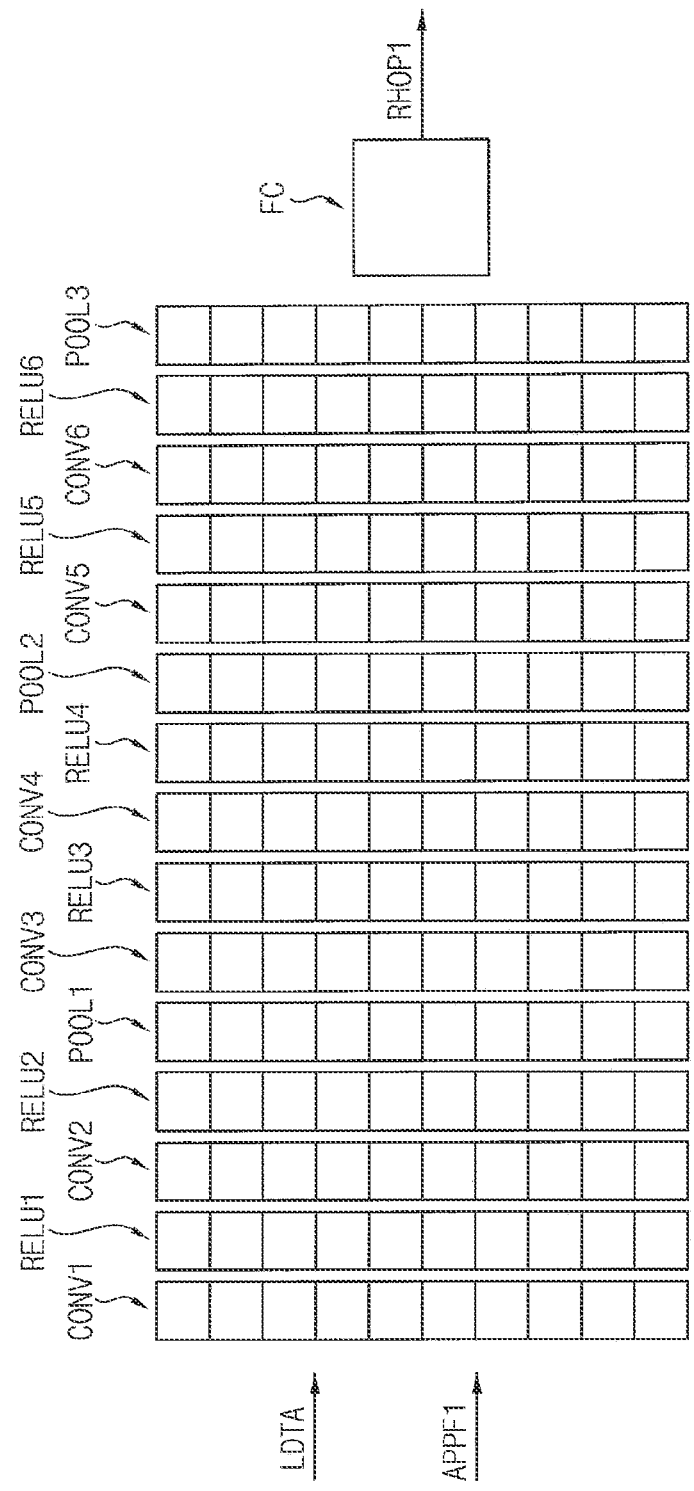

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | L | V | V |
| RD | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | V | V | CID3 |

FIG. 22

| CMD | CS_n | CA0 | CA1 | CA2 | CA3 | CA4 | CA5 | CA6 | CA7 | CA8 | CA9 | CA10 | CA11 | CA12 | CA13 |
|-----|------|-----|-----|-----|-----|-----|-----|-----|-----|-----|-----|------|------|------|------|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | L | CID3 | BA0 | BA1 | BG0 | BG1 | BG2 | CID0 | CID1 | CID2 |

US 11,942,137 B2

MEMORY CONTROLLER AND MEMORY SYSTEM INCLUDING THE SAME

CROSS-REFERENCE TO RELATED APPLICATIONS

This application claims the benefit of priority under 35 USC § 119 to Korean Patent Application No. 10-2021-0152154, filed on Nov. 8, 2021, and to Korean Patent Application No. 10-2022-0002444, filed on Jan. 7, 2022, in the Korean Intellectual Property Office, the disclosure of each of which is incorporated by reference in its entirety herein.

BACKGROUND

Example embodiments relate to memories and, more particularly, to memory controllers to detect a row hammer based on machine learning, semiconductor memory devices to detect a row hammer based on machine learning, and memory systems to detect a row hammer based on machine learning.

A semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharged state (i.e., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

Example embodiments may provide a memory controller, to control a semiconductor memory device, capable of detecting row hammering due to a malicious access pattern based on machine learning.

Example embodiments may provide a semiconductor memory device capable of detecting row hammering due to a malicious access pattern based on machine learning.

Example embodiments may provide a memory system capable of detecting row hammering due to a malicious access pattern based on machine learning.

According to example embodiments, a memory controller to control a semiconductor memory device includes an access pattern profiler, a row hammer prediction neural network, and a memory interface. The access pattern profiler generates a first access pattern profile based on a first row access pattern associated with a first access on at least a second portion of a plurality of memory cell rows of the semiconductor memory device during a first reference time interval posterior to a first refresh interval during which at least a first portion of the plurality of memory cell rows are refreshed. The row hammer prediction neural network performs machine learning based on learning data, predicts a first probability of occurrence of a row hammer in which at least one of the plurality of memory cell rows is intensively accessed by the first row access pattern, based on the first access pattern profile, and in response to the first probability being equal to or greater than a reference value, generates a hammer address associated with the row hammer, an alert signal indicating that the row hammer occurs, and an outcast row list associated with outcast memory cell rows from among the plurality of memory cell rows which are excluded from a hammer refresh operation that is performed in the semiconductor memory device in response to the first row access pattern. The memory interface transmits the hammer address, the outcast row list, and the alert signal to the semiconductor memory device.

According to example embodiments, a semiconductor memory device includes a memory cell array including a plurality of memory cell rows, each of which includes a plurality of volatile memory cells, a row hammer management engine, and a refresh control circuit. The row hammer management engine predicts a first probability of occurrence of a row hammer in which at least one of the plurality of memory cell rows is intensively accessed by a first row access pattern on at least a second portion on the plurality of memory cell rows during a first reference time interval posterior to a first refresh interval during which at least a first portion of the plurality of memory cell rows are refreshed, based on machine learning, and generates a hammer address associated with the row hammer, an alert signal indicating that the row hammer occurs, and an outcast row list associated with outcast memory cell rows from among the plurality of memory cell rows, which are excluded from a hammer refresh operation for coping with the row hammer. The refresh control circuit receives the hammer address, the alert signal and the outcast row list, performs the hammer refresh operation on one or more victim memory cell rows which are physically adjacent to a memory cell row corresponding to the hammer address, and performs a target refresh operation on the outcast memory cell rows based on the outcast row list.

According to example embodiments, a memory system includes a semiconductor memory device and a memory controller to control the semiconductor memory device. The semiconductor memory device includes a memory cell array including a plurality of memory cell rows, each of which includes a plurality of volatile memory cells. The memory controller includes an access pattern profiler, a row hammer prediction neural network, and a memory interface. The access pattern profiler generates a first access pattern profile based on a first row access pattern associated with a first access on at least a second portion of the plurality of memory cell rows during a first reference time interval posterior to a first refresh interval during which at least a first portion of the plurality of memory cell rows are refreshed. The row hammer prediction neural network performs machine learning based on learning data, predicts a first probability of occurrence of a row hammer in which at least one of the plurality of memory cell rows is intensively accessed by the first row access pattern, based on the first access pattern profile, and in response to the first probability being equal to or greater than a reference value, generates a hammer address associated with the row hammer, an alert signal indicating that the row hammer occurs, and an outcast row list associated with outcast memory cell rows from among the plurality of memory cell rows which are excluded from a hammer refresh operation that is performed in the semiconductor memory device in response to the first row access pattern. The memory interface transmits the hammer address, the outcast row list, and the alert signal to the semiconductor memory device. The semiconductor memory device, in response to the alert signal, performs the hammer refresh operation on one or more victim memory cell rows which are physically adjacent to a memory cell row corresponding to the hammer address and performs a target refresh operation on the outcast memory cell rows based on the outcast row list.

Accordingly, the memory controller and the semiconductor memory device may generate an access pattern profile based on an access pattern during a reference time interval, may predict a probability of occurrence of a row hammer based on the access pattern profile and based on machine learning, may generate a hammer address, an outcast row list, and an alert signal in response to the probability being equal to or greater than a reference value, may perform a hammer refresh operation on one or victim memory cell rows physically adjacent a memory cell row corresponding to the hammer address, and may perform a target refresh operation on outcast memory cell rows based on the outcast row list. Therefore, the memory controller and the semiconductor memory device may cope with a malicious access pattern with is known or unknown.

BRIEF DESCRIPTION OF THE DRAWINGS

Example embodiments will be described below in more detail with reference to the accompanying drawings.

FIG. 4 illustrates an example operation of an aggressor row classification module in FIG. 3 according to example embodiments.

FIGS. 10A, 10B and 10C are diagrams for describing examples of a neural network model that may be included in the neural network in FIG. 9 according to example embodiments.

FIGS. 21 and 22 illustrate example commands which may be used in the memory system of FIG. 1 or the memory system of FIG. 16.

DETAILED DESCRIPTION

Various example embodiments will be described more fully hereinafter with reference to the accompanying drawings, in which example embodiments are shown.

Figure 1:
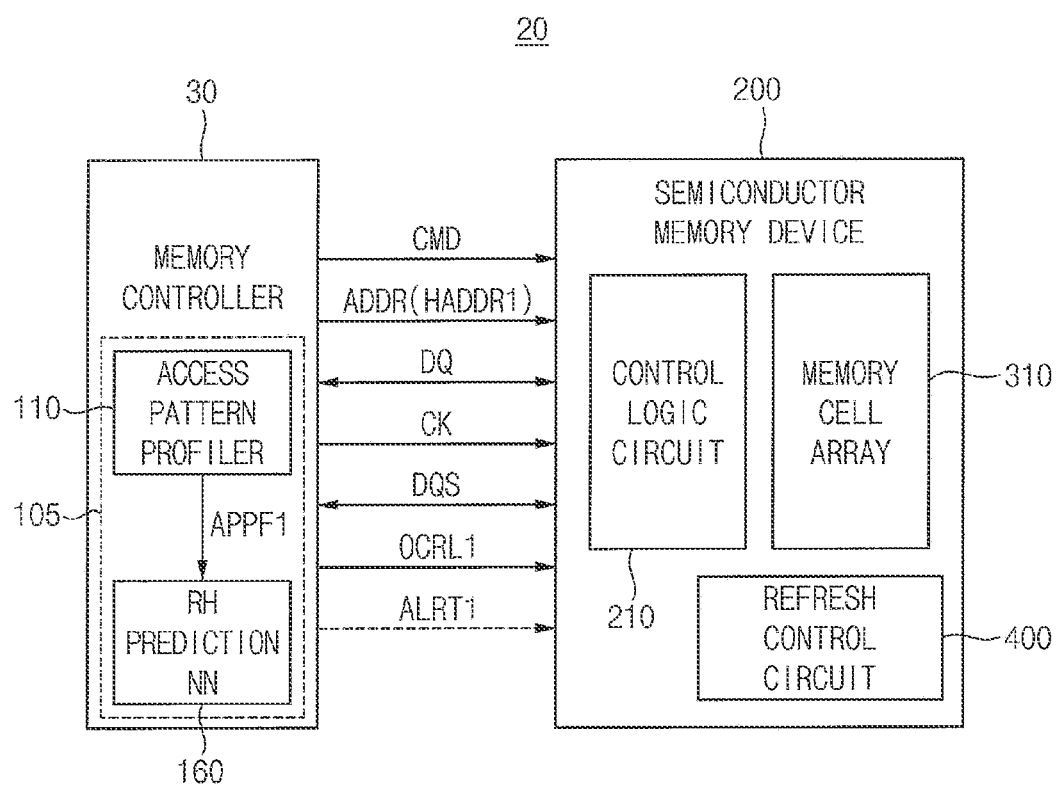
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), or a DDR6 SDRAM.

The memory controller 30 may transmit a clock signal CK (the clock signal CK may be referred to a command clock signal), a command CMD, and an address (signal) ADDR to the semiconductor memory device 200. The memory controller 30 may exchange a (data) strobe signal DQS with the semiconductor memory device 200 when the memory controller 30 transmits the data signal DQ to the semiconductor memory device 200 or receives the data signal DQ from the semiconductor memory device 200. The address ADDR may be accompanied by the command CMD, and the address ADDR may be referred to as an access address.

The memory controller 30 may include a row hammer management engine 105 that detects a hammer address HADDR1 of at least one of a plurality of memory cell rows of the semiconductor memory device 200 that is intensively accessed among from a plurality of memory cell rows of the semiconductor memory device 200. The memory controller 30 may transmit, to the semiconductor memory device 200, the hammer address HADDR1 and an outcast row list OCRL1 associated with outcast memory cell rows, from among the plurality of memory cell rows, which are excluded from a hammer refresh operation that is performed for coping with the row hammer in the semiconductor memory device 200. In addition, the memory controller 30 may transmit, to the semiconductor memory device 200, an alert signal ALRT1 indicating that the row hammer occurs.

The row hammer management engine 105 may include an access pattern profiler 110 and a row hammer (RH) prediction neural network (NN) 160. The access pattern profiler 110 may generate an access pattern profile APPF1 based on an access pattern of the plurality of memory cell rows and may provide the access pattern profile APPF1 to the row hammer prediction neural network 160. The row hammer prediction neural network 160 may predict a probability of occurrence of a row hammer based on the access pattern profile APPF1 and based on machine learning and may transmit the hammer address HADDR1, the outcast row list OCRL1, and the alert signal ALRT1 to the semiconductor memory device 200, in response to the probability being equal to or greater than a reference value.

The semiconductor memory device 200 includes a memory cell array 310 that stores the data signal DQ, a control logic circuit 210 and a refresh control circuit 400.

The control logic circuit 210 may control operations of the semiconductor memory device 200. The refresh control circuit 400 may receive the hammer address HADDR and the outcast row list OCRL1, may perform a hammer refresh operation on one or more victim memory cell rows physically adjacent to a memory cell row corresponding to the hammer address HADDR, and may perform a target refresh operation on the outcast memory cell rows based on the outcast row list OCRL1. In addition, the refresh control circuit 400 may control (or perform) a refresh operation on the plurality of memory cell rows in the memory cell array 310.

The semiconductor memory device 200 performs the refresh operation periodically due to charge leakage of memory cells storing data. Due to scale down of the manufacturing process of the semiconductor memory device 200, the storage capacitance of the memory cell is decreased and the refresh period is shortened. The refresh period is further shortened because the entire refresh time is increased as the memory capacity of the semiconductor memory device 200 is increased.

When a specific memory cell row is intensively accessed due to a malicious access pattern, a hammer refresh operation is performed on the specific memory cell row. However, because the hammer refresh operation is not performed on the outcast memory cell rows that are not physically adjacent to the specific memory cell row, charges stored in the outcast memory cell rows may be lost.

In the memory system 20 according to example embodiments, the memory controller 30 transmits the outcast row list OCRL1 associated with the outcast memory cells in addition to the hammer address HADDR1 to the semiconductor memory device 200 and the semiconductor memory device 200 performs the target refresh operation on the outcast memory cell rows based on the outcast row list OCRL1, and thus performance of the memory system 20 may be enhanced.

Figure 2:
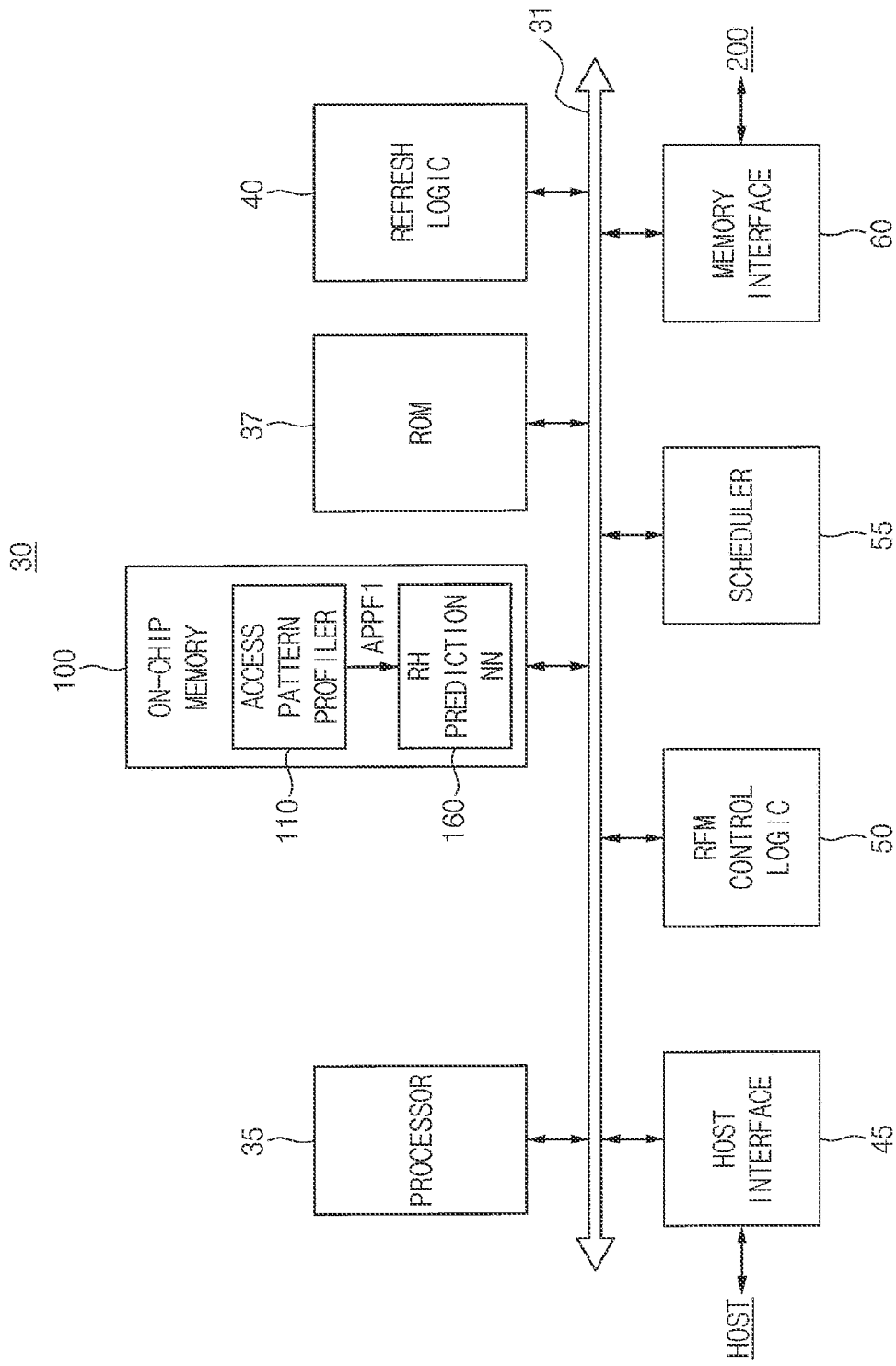
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include a processor 35, an on-chip memory 100, a ROM 37, a refresh logic 40, a host interface 45, a refresh management (RFM) control logic 50, a scheduler 55 and a memory interface 60 which are connected to each other through a bus 31.

The ROM 37 may store the access pattern profiler 110 and the row hammer prediction neural network 160. The access pattern profiler 110 and the row hammer prediction neural network 160 stored in the ROM 37 may be loaded onto the on-chip memory 100.

The processor 35 may control overall operation of the memory controller 30. The processor 35 may control the refresh logic 40, the host interface 45, the RFM control logic 50, the scheduler 55 and the memory interface 60 through the bus 31. The processor 35 may execute the access pattern profiler 110 and the row hammer prediction neural network 160 stored in the ROM 37 loaded onto the on-chip memory 100.

The refresh logic 40 may generate an auto refresh command for refreshing memory cells of the plurality of memory cell rows based on a refresh period of the semiconductor memory device 200. The RFM control logic 50 may generate a RFM command associated with a row hammer of the plurality of memory cell rows.

The host interface 50 may perform interfacing with a host. The memory interface 60 may perform interfacing with the semiconductor memory device 200.

The scheduler 55 may manage scheduling and transmission of sequences of commands generated in the memory controller 30. The scheduler 55 may transmit the hammer address HADDR1 and the outcast row list OCRL1 to the semiconductor memory device 200 via the memory interface 60.

The access pattern profiler 110 may generate the access pattern profile APPF1 based on a row access pattern associated with a first access on at least a second portion of a plurality of memory cell rows of the semiconductor memory device 200 during a reference time interval posterior to a refresh interval during which at least a first portion of the plurality of memory cell rows are refreshed.

The row hammer prediction neural network 160 may perform machine learning based on learning data, may predict a probability of occurrence of a row hammer due to at least one of the plurality of memory cell rows being intensively accessed by the row access pattern, based on the access pattern profile APPF1, in response to the probability being equal to or greater than a reference value, and may generate the hammer address HADDR1 associated with the row hammer, the outcast row list OCRL1 and the alert signal ALRT1 indicating that the row hammer occurs. The outcast row list OCRL1 may be associated with the outcast memory cell rows, which are excluded from the hammer refresh operation that is performed in the semiconductor memory device 200 in response to the row access pattern.

Figure 3:
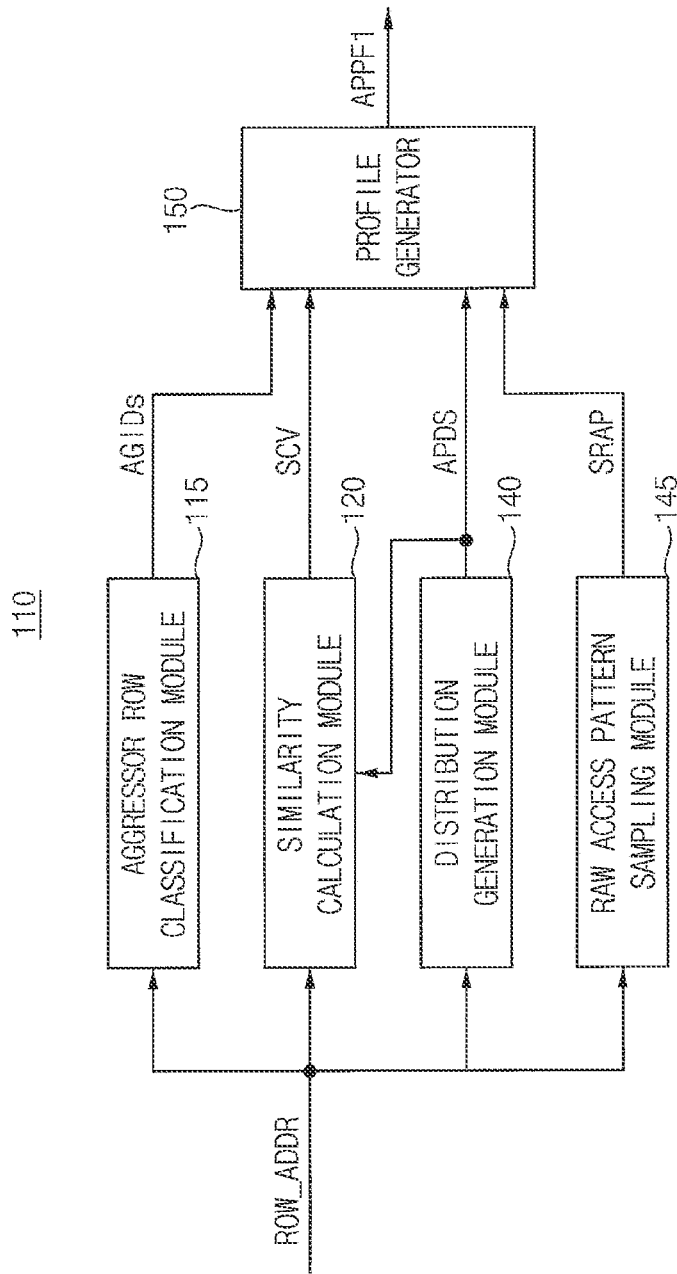
FIG. 3 is a block diagram illustrating an example of the access pattern profiler in FIG. 2 according to example embodiments.

FIG. 3 is a block diagram illustrating an example of the access pattern profiler in FIG. 2 according to example embodiments.

Referring to FIG. 3, the access pattern profiler 110 may include an aggressor row classification module 115, a similarity calculation module 120, a distribution generation module 140, a raw access pattern sampling module 145 and a profile generator 150.

The aggressor row classification module 115 may map row addresses ROW_ADDR included in the row access pattern to aggressor identifiers AGIDs.

The similarity calculation module 120 may generate a (first) counted value SCV indicating a (first) similarity between first refresh row addresses that are frequently refreshed during the first refresh interval during which the refresh row addresses are refreshed and the (first) row addresses ROW_ADDR accessed during the reference time interval.

The distribution generation module 140 may generate a distribution APDS of the number of accesses of the aggressor row identifiers AGIDs during the reference time interval.

In an example embodiment, the distribution generation module 140 may generate the distribution APDS of the number of accesses of the refresh row addresses based on the refresh row addresses that are refreshed during a refresh interval and may provide the distribution APDS to the similarity calculation module 120. The similarity calculation module 120 may generate the counted value SCV indicating a similarity between first refresh row addresses that are frequently refreshed during the refresh interval and the row addresses ROW_ADDR accessed during the reference time interval.

The profile generator 150 may generate the access pattern profile APPF1 based on the aggressor identifiers AGIDs, the similarity SCV, and the distribution APDS.

The raw access pattern sampling module 145 may sample a portion of the row access pattern to provide a sampled raw access pattern SRAP to the profile generator 150, and the profile generator 150 may generate the access pattern profile APPF1 further based on the sampled raw access pattern SRAP.

The aggressor row classification module 115, the similarity calculation module 120, the distribution generation module 140, and the raw access pattern sampling module 145 operate in parallel (or concurrently).

FIG. 4 illustrates an example operation of an aggressor row classification module in FIG. 3 according to example embodiments.

Referring to FIG. 4, the aggressor row classification module 115 may map row addresses RA1, RA3, RA7 and RA8 included in the access pattern during the reference time interval to corresponding aggressor row identifiers ARID1, ARID3, ARID7 and ARID8, respectively. When the aggressor row classification module 115 maps the row address ROW_ADDR to the aggressor row identifier AGRI, calculation amount of the row hammer prediction neural network 160 may be reduced, when the row hammer prediction neural network 160 performs learning or inferring because the number of bits in the aggressor row identifier AGRI is smaller than the number of bits in the row address ROW_ADDR.

Figure 5:
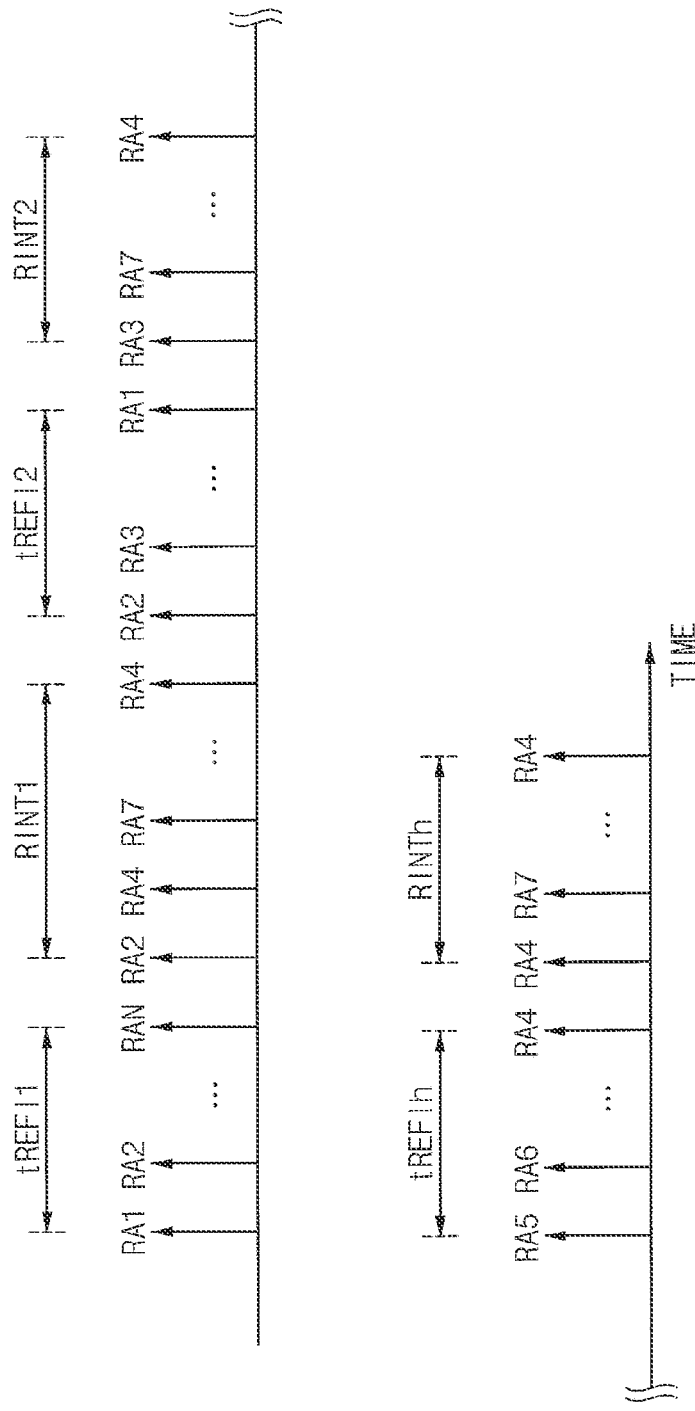
FIG. 5 illustrates that the access pattern profiler of FIG. 3 operates in a plurality of reference time intervals including a first reference time interval and a second reference time interval according to example embodiments.

FIG. 5 illustrates that the access pattern profiler of FIG. 3 operates in a plurality of reference time intervals including a first reference time interval and a second reference time interval according to example embodiments.

Referring to FIGS. 3 and 5, the access pattern profiler 110 may generate a first access pattern profile based on a first row access pattern associated with a first access including row addresses RA2, RA4, RA7, . . . , RA4 on at least a (second) portion of a plurality of memory cell rows during a first reference time interval RINT1 posterior to a first refresh interval tREFI1 during which memory cell rows designated by row addresses RA1, RA2, . . . , RAN are refreshed. Here N is an integer equal to or greater than three. The row hammer prediction neural network 160 may predict a first probability of occurrence of a row hammer by the first row access pattern, based on the first access pattern profile during the first reference time interval RINT1.

The access pattern profiler 110 may generate a second access pattern profile based on a second row access pattern associated with a second access including row addresses RA3, RA7, . . . , RA4 on at least a (second) portion of a plurality of memory cell rows during a second reference time interval RINT2 posterior to a second refresh interval tREFI2 during which memory cell rows designated by row addresses RA2, RA3, . . . , RA1 are refreshed. The row hammer prediction neural network 160 may predict a second probability of occurrence of the row hammer by the second row access pattern, based on the second access pattern profile during the second reference time interval RINT2.

The access pattern profiler 110 may generate an h-th access pattern profile based on an h-th row access pattern associated with an h-th access including row addresses RA4, RA7, . . . , RA4 on at least a portion of a plurality of memory cell rows during an h-th reference time interval RINTh posterior to an h-th refresh interval tREFIh during which memory cell rows designated by row addresses RA5, RA6, . . . , RA4 are refreshed. The row hammer prediction neural network 160 may predict an h-th probability of occurrence of the row hammer by the h-th row access pattern, based on the h-th access pattern profile during the h-th reference time interval RINTh.

In each of the first through h-th refresh intervals tREFI1~tREFIh, at least one memory cell row may be refreshed and each of the first through h-th refresh intervals tREFI1~tREFIh may correspond to one of an auto refresh interval and a self-refresh interval.

Figure 6:
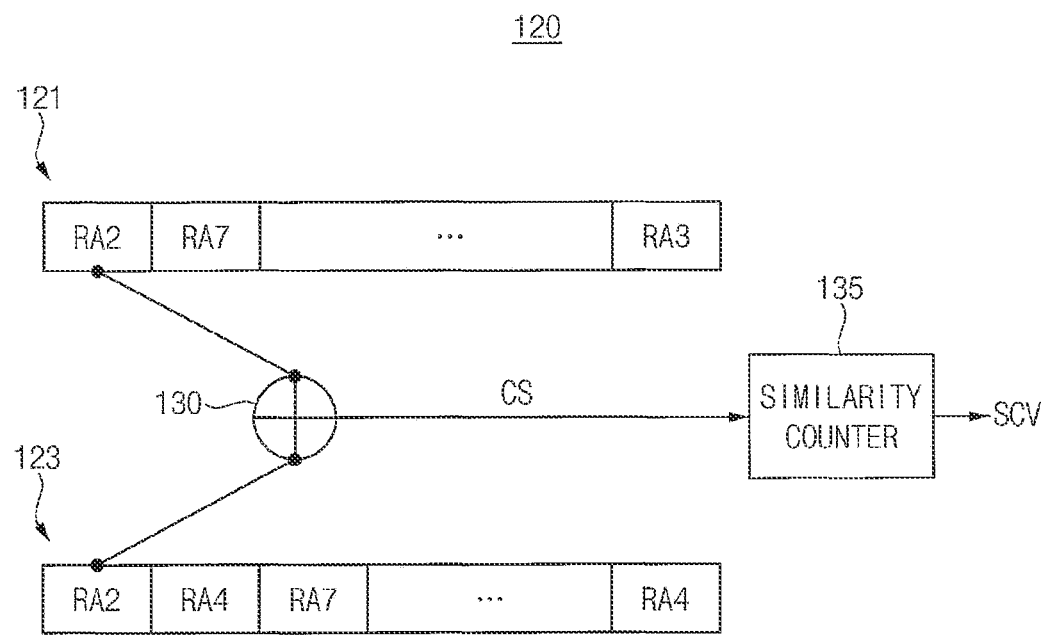
FIG. 6 is a block diagram illustrating an example of the similarity calculation module in the access pattern profiler of FIG. 3 according to example embodiments.

FIG. 6 is a block diagram illustrating an example of the similarity calculation module in the access pattern profiler of FIG. 3 according to example embodiments.

Referring to FIG. 6, the similarity calculation module 120 may include a first register 121, a second register 123, a comparator 130 and a similarity counter 135.

The first register 121 may store first refresh row addresses RA2, RA7, . . . , RA3 of first memory cell rows which are more frequently refreshed than other memory cell rows during the first refresh interval tREFI1 and the second register 123 may store second row addresses RA2, RA4, RA7, . . . , RA4 of second memory cell rows associated with the first access during the first reference time interval RINT1.

The comparator 130 may compare each of the first refresh row addresses RA2, RA7, . . . , RA3 stored in the first register 121 and each of the second row addresses RA2, RA4, RA7, . . . , RA4 stored in the second register 123 and may provide the similarity counter 135 with a comparison signal CS indicating a result of the comparison.

The similarity counter 135 may count the comparison signal CS having a first logic level (e.g., a logic high level) to output the counted value SCV indicating a similarity between the first refresh row addresses RA2, RA7, ..., RA3 and the second row addresses RA2, RA4, RA7, ..., RA4. The similarity counter 135 may be reset when the counting based on comparing each of the first refresh row addresses RA2, RA7, ..., RA3 stored in the first register 121 and each of the second row addresses RA2, RA4, RA7, ..., RA4 stored in the second register 123 is completed. The counted value SCV reaching a reference counted value may indicate a situation that similar row addresses are intensively accessed. That is, the counted value SCV reaching the reference counted value may indicate that a probability of row hammer occurring is high.

Figure 7:
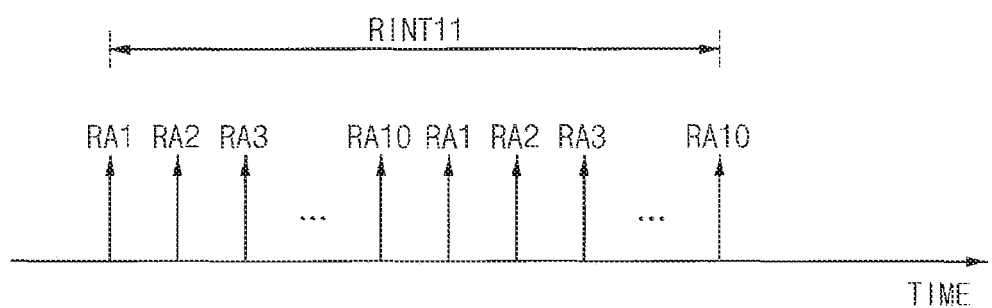
FIG. 7 illustrates that a repeated access pattern is applied during a first reference time interval.

FIG. 7 illustrates that a repeated access pattern is applied during a first reference time interval.

Referring to FIG. 7, when an access pattern repeated with an order of row addresses RA1, RA2, RA3, ..., RA10 is applied to the memory system 20 or the semiconductor memory device 200 during a first reference time interval RINT11, the row hammer prediction neural network 160 may detect an occurrence of the row hammer based on the counted value SCV included in the access pattern profile APPF1, may generate the alert signal ALRT1 and the hammer address HADDR1, and may transmit the alert signal ALRT1 and the hammer address HADDR1 to the semiconductor memory device 200. The semiconductor memory device 200 may perform a hammer refresh operation in response to the alert signal ALRT1 and the hammer address HADDR1.

Figure 8:
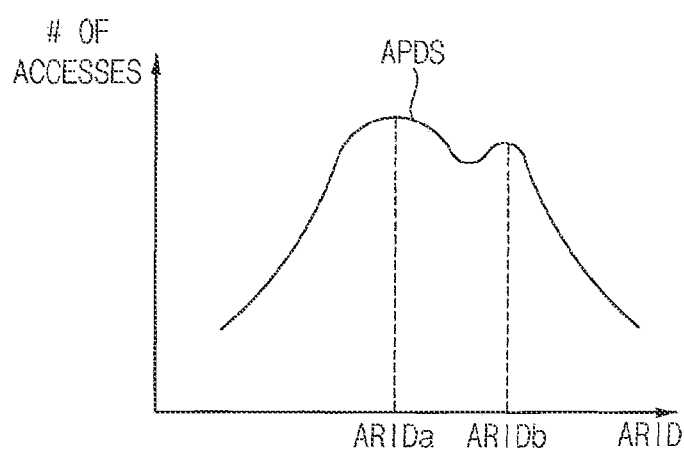
FIG. 8 illustrates an example of a distribution generated by the distribution generation module in FIG. 3 according to example embodiments.

FIG. 8 illustrates an example of a distribution generated by the distribution generation module in FIG. 3 according to example embodiments.

Referring to FIGS. 3 and 8, the distribution generation module 140 may generate the distribution APDS associated with the number of accesses of each of refresh row addresses that are refreshed during a refresh interval and associated with the number of accesses of each of the aggressor row identifiers AGIDs during a reference time interval.

In example embodiments, when it is difficult to generate the distribution APDS associated with the number of accesses, the distribution generation module 140 may generate a simplified distribution based on statistical characteristic values representing each of the refresh interval and the reference time interval and information on a row address list including row addresses that are frequently accessed and may provide the simplified distribution to the profile generator 150.

The row hammer prediction neural network 160 may identify a row address of a memory cell row designated by an aggressor row identifier ARIDa having a greatest number of accesses as the hammer address HADDRa based on the distribution APDS included in the access pattern profile APPF1 and may include a row address of a memory cell row, which is not adjacent to the memory cell row designated by the aggressor row identifier ARIDa and is designated by an aggressor row identifier ARIDb having a high probability of row hammer occurring, in the outcast row list.

Figure 9:
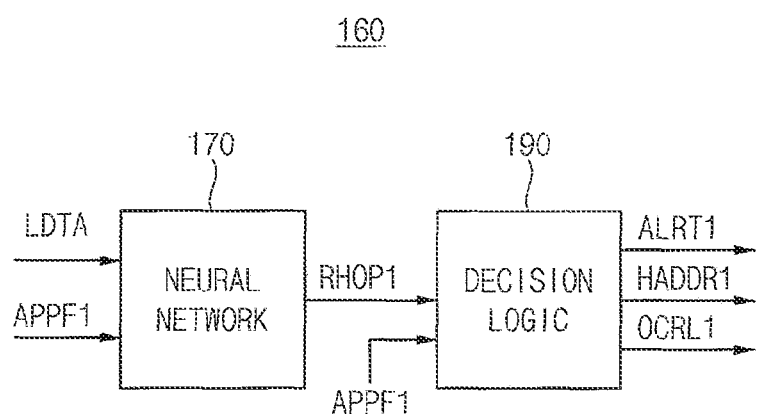
FIG. 9 is a block diagram illustrating an example of the row hammer prediction neural network in FIG. 2 according to example embodiments.

FIG. 9 is a block diagram illustrating an example of the row hammer prediction neural network in FIG. 2 according to example embodiments.

Referring to FIG. 9, the row hammer prediction neural network 160 may include a neural network 170 and a decision logic 190.

The neural network 170 may perform the machine learning based on learning data LDTA and may predict a probability RHOP1 of occurrence of the row hammer based on the access pattern profile APPF1. The learning data LDTA may be data set to instruct the neural network 170 to predict a probability of occurrence of the row hammer during a test before a normal operation of the memory system 20.

The decision logic 190 may compare the probability RHOP1 of occurrence of the row hammer with a first reference value, may generate the hammer address HADDR1, the outcast row list OCRL1 and the alert signal ALRT1 based on the access pattern profile APPF1, in response to the probability RHOP1 being equal to or greater than the reference value, and may transmit the hammer address HADDR1, the outcast row list OCRL1 and the alert signal ALRT1 to the semiconductor memory device 200 via the memory interface 60.

Figure 10A:
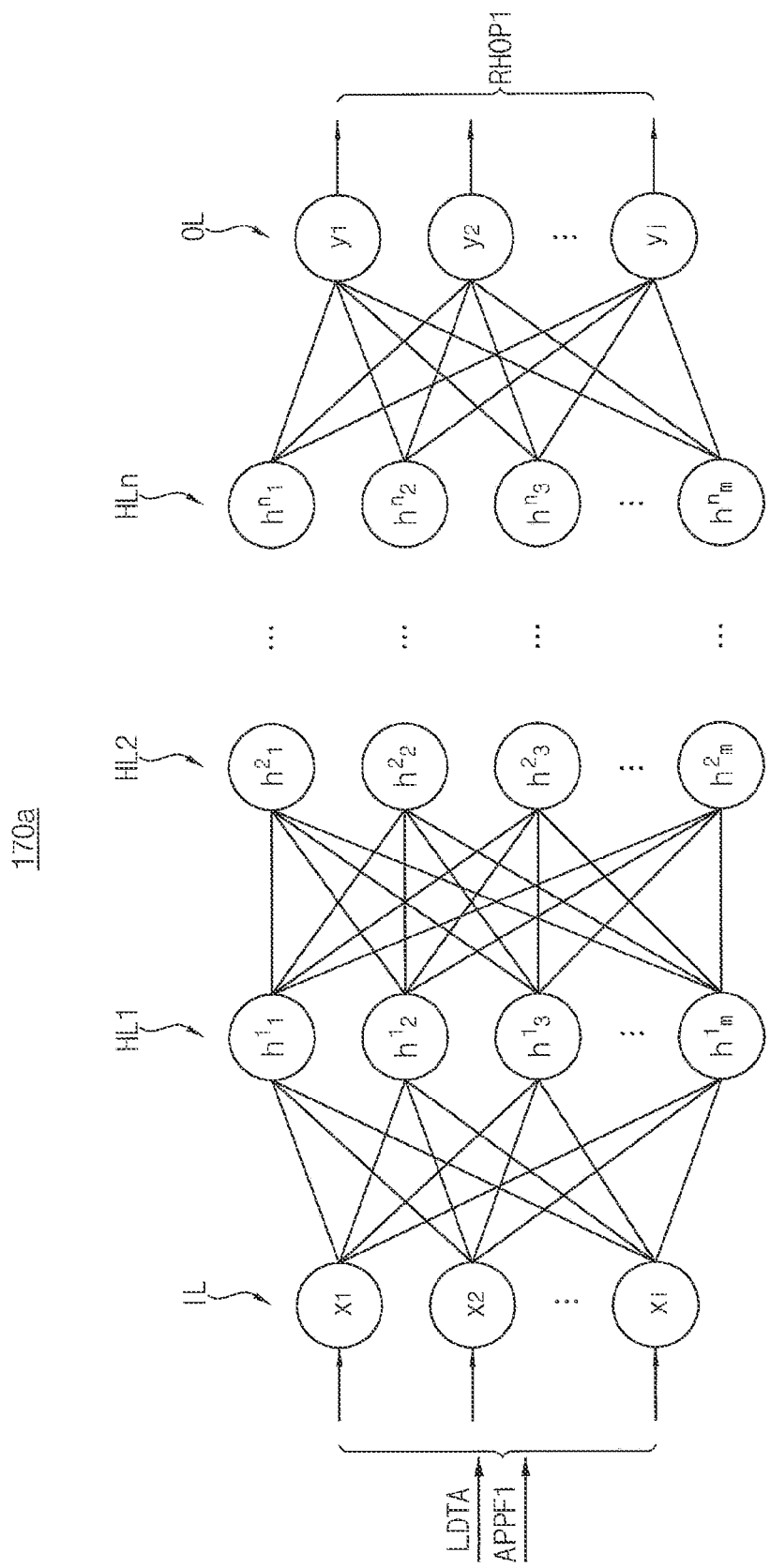
Figure 10C:
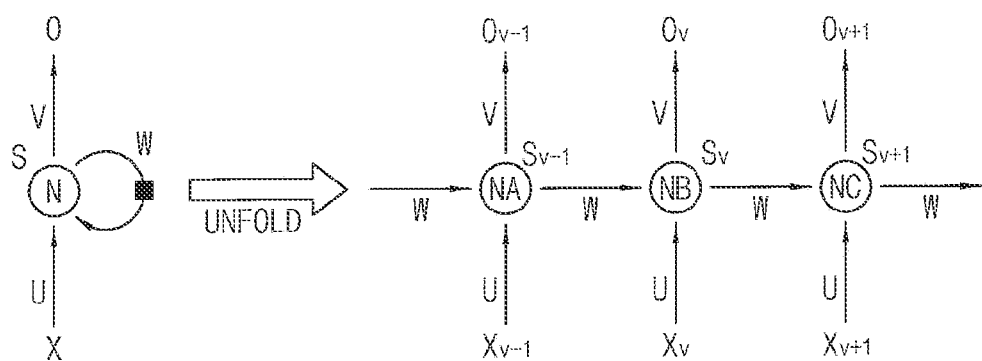

FIGS. 10A, 10B and 10C are diagrams for describing examples of a neural network model that may be included in the neural network in FIG. 9 according to example embodiments.

FIGS. 10A, 10B and 10C illustrate examples of a network structure of a neural network model, and FIG. 6 illustrates an example of a neural network system that is used to execute and/or drive the neural network model. For example, the neural network model may include at least one of an artificial neural network (ANN) model, a convolutional neural network (CNN) model, a recurrent neural network (RNN) model, a deep neural network (DNN) model, or the like.

Referring to FIG. 10A, a neural network 170a may include an input layer IL, a plurality of hidden layers HL1, HL2, ..., HLn and an output layer OL.

The input layer IL may include i input nodes $x_1$, $x_2$, ..., $x_i$, where i is a natural number. Learning data (e.g., vector learning data) LDTA whose length is i may be input to the input nodes $x_1$, $x_2$, ..., $x_i$ such that each element of the learning data LDTA is input to a respective one of the input nodes $x_1$, $x_2$, ..., $x_i$.

The plurality of hidden layers HL1, HL2, ..., HLn may include n hidden layers, where n is a natural number, and may include a plurality of hidden nodes $h^1_1$, $h^1_2$, $h^1_3$, ..., $h^1_m$, $h^2_1$, $h^2_2$, $h^2_3$, ..., $h^2_m$, $h^n_1$, $h^n_2$, ... $h^n_3$, ..., $h^n_m$. For example, the hidden layer HL1 may include m hidden nodes $h^1_1$, $h^1_2$, $h^1_3$, ..., $h^1_m$, the hidden layer HL2 may include m hidden nodes $h^2_1$, $h^2_2$, $h^2_3$, ..., $h^2_m$, and the hidden layer HLn may include m hidden nodes $h^n_1$, $h^n_2$, $h^n_3$, ..., $h^n_m$, where m is a natural number.

The output layer OL may include j output nodes y1, y2, ..., yj, where j is a natural number. Each of the output nodes y1, y2, ..., yj may correspond to a respective one of classes to be categorized. The output layer OL may generate the probability RHOP1 of occurrence of the row hammer in the learning data LDTA or the access pattern profile APPF1. In some example embodiments, the output layer OL may be a fully-connected layer.

A structure of the neural network illustrated in FIG. 10A may be represented by information on branches (or connections) between nodes illustrated as lines and a weighted value assigned to each branch, which is not illustrated. In some neural network models, nodes within one layer may not be connected to one another, but nodes of different layers may be fully or partially connected to one another. In some other neural network models, such as unrestricted Boltzmann machines, at least some nodes within one layer may also be connected to other nodes within one layer in addition to (or alternatively with) one or more nodes of other layers.

Each node (e.g., the node $h^1_1$) may receive an output of a previous node (e.g., the node $x_1$), may perform a computing operation, computation or calculation on the received output, and may output a result of the computing operation, computation or calculation as an output to a next node (e.g., the node $h^2_1$). Each node may calculate a value to be output by applying the input to a specific function, e.g., a nonlinear function.

In example embodiments, the structure of the neural network is set in advance and the weighted values for the connections between the nodes are set appropriately using data having an already known answer of which class the data belongs to (sometimes referred to as a "label"). The data with the already known answer is sometimes referred to as "training data", and a process of determining the weighted value is sometimes referred to as "training". The neural network "learns" to associate the data with corresponding labels during the training process. A group of an independently trainable structure and the weighted value is sometimes referred to as a "model", and a process of predicting, by the model with the determined weighted value, which class the input data belongs to and then outputting the predicted value is sometimes referred to as a "testing" process.

Referring to FIG. 10B, a network structure 170b of a CNN may include a plurality of layers CONV1, RELU1, CONV2, RELU2, POOL1, CONV3, RELU3, CONV4, RELU4, POOL2, CONV5, RELU5, CONV6, RELU6, POOLS and FC.

Unlike the general neural network, each layer of the CNN may have three dimensions of width, height and depth, and thus data that is input to each layer may be volume data having three dimensions of width, height and depth.

Each of the convolutional layers CONV1, CONV2, CONV3, CONV4, CONV5 and CONV6 may perform a convolutional operation on input volume data.

Parameters of each convolutional layer may consist of a set of learnable filters. Every filter may be small spatially (along width and height), but may extend through the full depth of an input volume. For example, during the forward pass, each filter may be slid (e.g. convolved) across the width and height of the input volume, and dot products may be computed between the entries of the filter and the input at any position. As the filter is slid over the width and height of the input volume, a two-dimensional activation map that gives the responses of that filter at every spatial position may be generated. As a result, an output volume may be generated by stacking these activation maps along the depth dimension. For example, if input volume data having a size of 32*32*3 passes through the convolutional layer CONV1 having four filters with zero-padding, output volume data of the convolutional layer CONV1 may have a size of 32*32*12 (e.g., a depth of volume data increases).

Each of the RELU layers RELU1, RELU2, RELU3, RELU4, RELU5 and RELU6 may perform a rectified linear unit (RELU) operation that corresponds to an activation function defined by, e.g., a function $f(x)=\max(0, x)$ (e.g., an output is zero for all negative input x). For example, if input volume data having a size of 32*32*12 passes through the RELU layer RELU1 to perform the rectified linear unit operation, output volume data of the RELU layer RELU1 may have a size of 32*32*12 (e.g., a size of volume data is maintained).

Each of the pooling layers POOL1, POOL2 and POOLS may perform a down-sampling operation on input volume data along spatial dimensions of width and height. For example, four input values arranged in a 2*2 matrix formation may be converted into one output value based on a 2*2 filter. For example, a maximum value of four input values arranged in a 2*2 matrix formation may be selected based on 2*2 maximum pooling, or an average value of four input values arranged in a 2*2 matrix formation may be obtained based on 2*2 average pooling. For example, if input volume data having a size of 32*32*12 passes through the pooling layer POOL1 having a 2*2 filter, output volume data of the pooling layer POOL1 may have a size of 16*16*12 (e.g., width and height of volume data decreases, and a depth of volume data is maintained).

Typically, one convolutional layer (e.g., CONV1) and one RELU layer (e.g., RELU1) may form a pair of CONV/RELU layers in the CNN, pairs of the CONV/RELU layers may be repeatedly arranged in the CNN, and the pooling layer may be periodically inserted in the CNN.

The output layer or fully-connected layer FC may output probability RHOP1 of occurrence of the row hammer in the learning data LDTA or the access pattern profile APPF1.

Referring to FIG. 10C, a network structure 170c of an RNN may include a repeating structure using a specific node or cell N illustrated on the left side of FIG. 10C.

A structure illustrated on the right side of FIG. 10C may indicate that a recurrent connection of the RNN illustrated on the left side is unfolded (or unrolled). The term "unfolded" means that the network is written out or illustrated for the complete or entire sequence including all nodes NA, NB and NC. For example, if the sequence of interest is a sentence of 3 words, the RNN may be unfolded into a 3-layer neural network, one layer for each word (e.g., without recurrent connections or without cycles).

In the RNN in FIG. 10C, X indicates an input of the RNN. For example, $X_v$ may be an input at time step v, and $X_{v-1}$ and $X_{v+1}$ may be inputs at time steps v-1 and v+1, respectively.

In the RNN in FIG. 10C, S indicates a hidden state. For example, $S_v$ may be a hidden state at the time step v, and $S_{v-1}$ and $S_{v+1}$ may be hidden states at the time steps v-1 and v+1, respectively. The hidden state may be calculated based on a previous hidden state and an input at a current step. For example, $S_v=f(UX_v+WS_{v-1})$. For example, the function f may be usually a nonlinearity function such as tan h or RELU. $S_{-1}$, which is required to calculate a first hidden state, may be typically initialized to all zeroes.

In the RNN in FIG. 10C, O indicates an output of the RNN. For example, $O_v$ may be an output at the time step v, and $O_{v-1}$ and $O_{v+1}$ may be outputs at the time steps v-1 and v+1, respectively. For example, if it is required to predict a next word in a sentence, it would be a vector of probabilities across a vocabulary. For example, $O_v=\text{softmax}(VS_v)$.

In the RNN in FIG. 10C, the hidden state may be a "memory" of the network. For example, the RNN may have a "memory" which captures information about what has been calculated so far. The hidden state $S_v$ may capture information about what happened in all the previous time steps. The output $O_v$ may be calculated solely based on the memory at the current time step v. In addition, unlike a traditional neural network, which uses different parameters at each layer, the RNN may share the same parameters (e.g., U, V and W in FIG. 10C) across all time steps. This may indicate the fact that the same task may be performed at each step, just with different inputs. This may greatly reduce the total number of parameters required to be trained or learned.

The RNN may output the probability RHOP1 of occurrence of the row hammer in the learning data LDTA or the access pattern profile APPF1.

Figure 11:
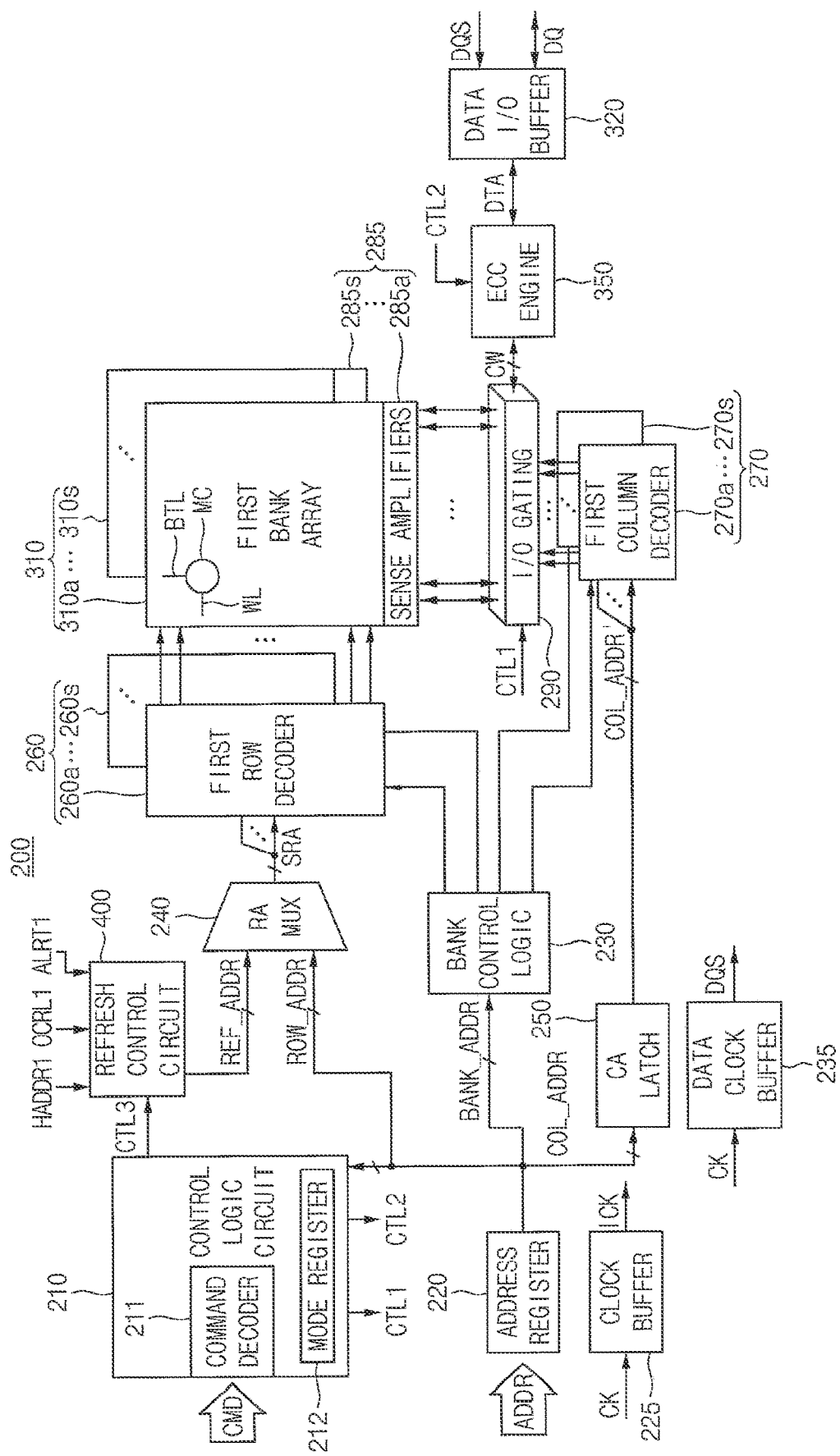
FIG. 11 is a block diagram illustrating the semiconductor memory device in the memory system of FIG. 1 according to example embodiments.

FIG. 11 is a block diagram illustrating the semiconductor memory device in the memory system of FIG. 1 according to example embodiments.

Referring to FIG. 11, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an I/O gating circuit 290, an error correction code (ECC) engine 350, a clock buffer 225, a data clock buffer 235 (also referred to as a strobe signal generator), and a data I/O buffer 320.

The memory cell array 310 may include first through sixteenth bank arrays 310a~310s. The row decoder 260 may include first through sixteenth row decoders 260a~260s respectively coupled to the first through sixteenth bank arrays 310a~310s, the column decoder 270 may include first through sixteenth column decoders 270a~270s respectively coupled to the first through sixteenth bank arrays 310a~310s, and the sense amplifier unit 285 may include first through sixteenth sense amplifiers 285a~285s respectively coupled to the first through sixteenth bank arrays 310a~310s.

The first through sixteenth bank arrays 310a~310s, the first through sixteenth row decoders 260a~260s, the first through sixteenth column decoders 270a~270s, and first through sixteenth sense amplifiers 285a~285s may form first through sixteenth banks. Each of the first through sixteenth bank arrays 310a~310s includes a plurality of memory cells MC formed at intersections of a plurality of word-lines WL and a plurality of bit-line BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through sixteenth row decoders 260a~260s corresponding to the bank address BANK_ADDR is activated in response to the bank control signals, and one of the first through sixteenth column decoders 270a~270s corresponding to the bank address BANK_ADDR is activated in response to the bank control signals.

The row address multiplexer 240 may receive the row address ROW_ADDR from the address register 220 and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260s.

The refresh control circuit 400 may sequentially increase or decrease the refresh row address REF_ADDR in a normal refresh mode in response to a third control signal CTL3 from the control logic circuit 210. The refresh control circuit 400 may receive the hammer address HADDR1, the alert signal ALRT1 and the outcast row list OCRL1, may perform a hammer refresh operation on one or more victim memory cell rows based on the hammer address HADDR1, and may perform a target refresh operation on the outcast memory cell rows based on the outcast row list OCRL1. The refresh control circuit 400 may output hammer refresh addresses designating the one or more victim memory cell rows physically adjacent to a memory cell row corresponding to the hammer address HADDR1 as the refresh row address REF_ADDR and may output target refresh addresses designating the outcast memory cell rows as the refresh row address REF_ADDR based on the outcast row list OCRL1.

The activated one of the first through sixteenth row decoders 260a~260s, by the bank control logic 230, may decode the row address SRA that is output from the row address multiplexer 240 and may activate a word-line corresponding to the row address SRA. For example, the activated bank row decoder applies a word-line driving voltage to the word-line corresponding to the row address.

The column address latch 250 may receive the column address COL_ADDR from the address register 220 and may temporarily store the received column address COL_ADDR. In some embodiments, in a burst mode, the column address latch 250 may generate a column address COL_ADDR' that increments from the received column address COL_ADDR. The column address latch 250 may apply the temporarily stored or generated column address COL_ADDR' to the first through sixteenth column decoders 270a~270s.

The activated one of the first through sixteenth column decoders 270a~270s activates a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a~310s, and write drivers for writing data to the first through sixteenth bank arrays 310a~310s.

A codeword CW read from a selected bank array of the first through sixteenth bank arrays 310a~310s is sensed by a sense amplifier coupled to the selected bank array from which the data is to be read and is stored in the read data latches. The codeword CW stored in the read data latches may be provided to the data I/O buffer 320 as data DTA after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected bank array of the first through sixteenth bank arrays 310a~310s may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform an ECC encoding on the data DTA and may perform an ECC decoding on the codeword CW based on a second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The data clock buffer 235 may receive the clock signal CK, may generate the data strobe signal DQS based on the clock signal CK, and may provide the data strobe signal DQS to the memory controller 30.

The control logic circuit 210 may control operations of the semiconductor memory device 200. For example, the control logic circuit 210 may generate control signals for the semiconductor memory device 200 to perform a write operation, a read operation, a normal refresh operation, a hammer refresh operation, and a target refresh operation. The control logic circuit 210 includes a command decoder 211 that decodes the command CMD received from the memory controller 30 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit, the second control signal CTL2 to control the ECC engine 350, and the third control signal CTL3 to control the refresh control circuit 400.

Figure 12:
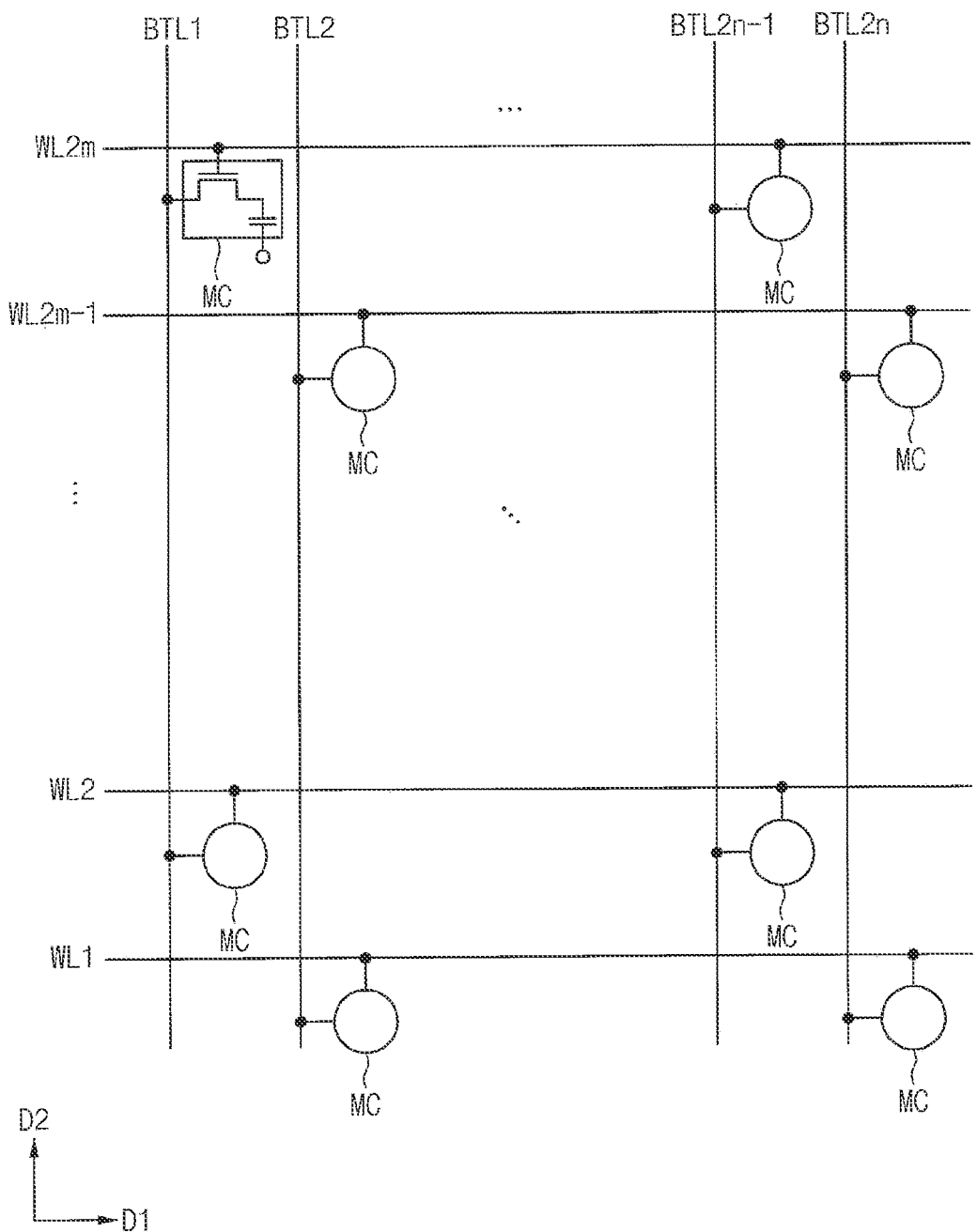
FIG. 12 illustrates an example of the first bank array in the semiconductor memory device of FIG. 11.

FIG. 12 illustrates an example of the first bank array in the semiconductor memory device of FIG. 11.

Referring to FIG. 12, the first bank array 310a includes a plurality of word-lines WL1~WL2m (m is a natural number greater than two), a plurality of bit-lines BTL1~BTL2n (n is a natural number greater than two), and a plurality of memory cells MCs disposed at intersections between the word-lines WL1~WL2m and the bit-lines BTL1~BTL2n. Each of the memory cells MCs includes a cell transistor coupled to each of the word-lines WL1~WL2m and each of the bit-lines BTL1~BTL2n and a cell capacitor coupled to the cell transistor.

The word-lines WL1~WL2m coupled to the plurality of memory cells MCs may be referred to as rows of the first bank array 310a and the bit-lines BTL1~BTL2n coupled to the a plurality of memory cells MCs may be referred to as columns of the first bank array 310a.

Figure 13:
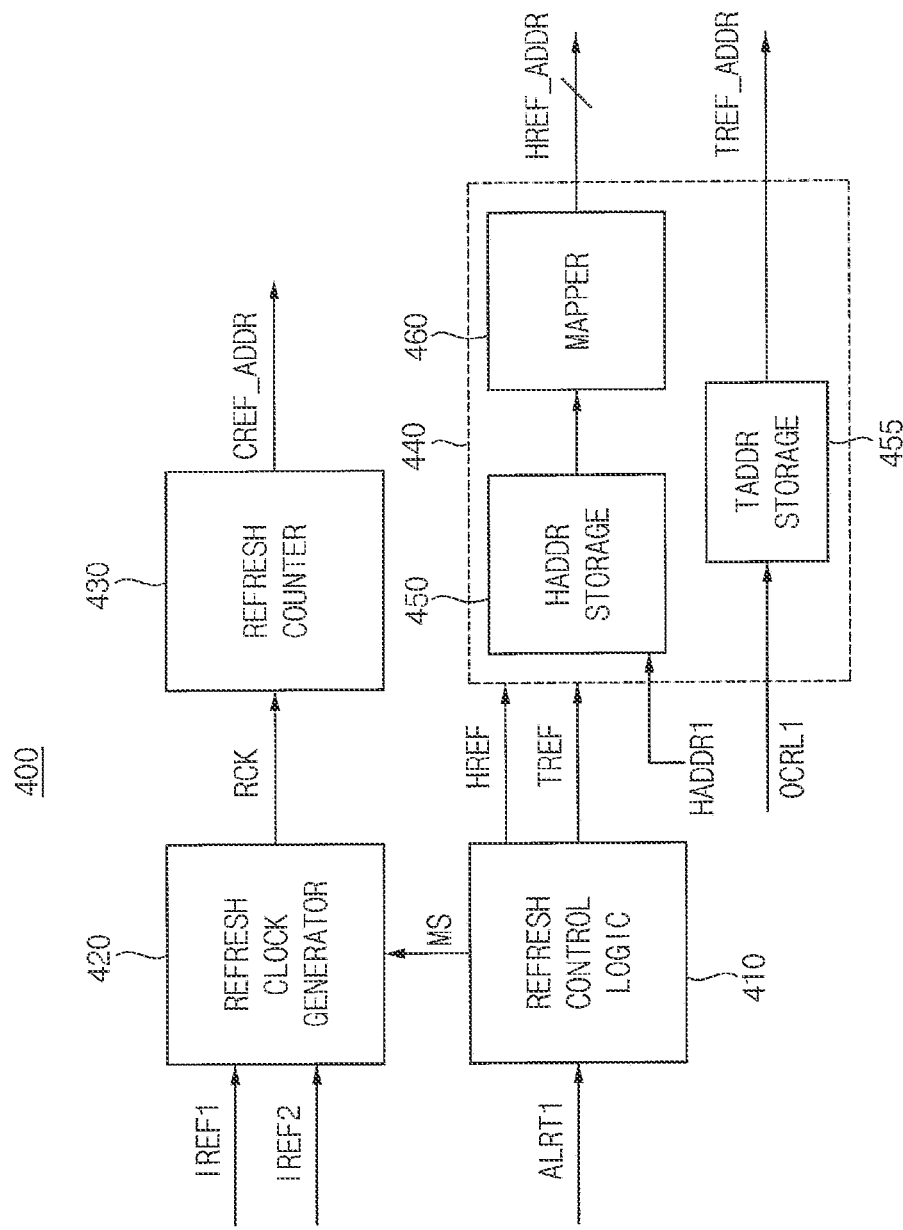
FIG. 13 is a block diagram illustrating an example of the refresh control circuit in FIG. 11 according to example embodiments.

FIG. 13 is a block diagram illustrating an example of the refresh control circuit in FIG. 11 according to example embodiments.

Referring to FIG. 13, the refresh control circuit 400 may include a refresh control logic 410, a refresh clock generator 420, a refresh counter 430 and a hammer refresh address generator 440.

The refresh control logic 410 may provide a mode signal MS in response to the alert signal ALRT1. In addition, the refresh control logic 410 may provide the hammer refresh address generator 440 with a hammer refresh signal HREF and a target refresh signal TREF.

The refresh clock generator 420 may generate a refresh clock signal RCK indicating a timing of a normal refresh operation based on a first refresh control signal IREF1, a second refresh control signal IREF2 and the mode signal MS. The refresh clock generator 420 may generate the refresh clock signal RCK in response to receiving the first refresh control signal IREF1 or in response to the second refresh control signal IREF2 being activated.

When the command CMD from the memory controller 30 corresponds to an auto refresh command, the control logic circuit 210 in FIG. 11 may apply the first refresh control signal IREF1 to the refresh control circuit 400 whenever the control logic circuit 210 receives the auto refresh command.

When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing a counting operation at the period of the refresh clock signal RCK and may provide the counter refresh address CREF_ADDR as the refresh row address REF_ADDR to the row address multiplexer 240 in FIG. 11.

The hammer refresh address generator 440 may include a hammer address storage 450, a target address storage 455 and a mapper 460.

The hammer address storage 450 may store the hammer address HADDR1 and may output the hammer address HADDR1 to the mapper 460 in response to the hammer refresh signal HREF. The mapper 460 may generate hammer refresh addresses HREF_ADDR designating one or more victim memory cell rows physically adjacent to a memory cell row corresponding to the hammer address HADDR1.

The target address storage 455 may receive the outcast row list OCRL1, may store a target refresh address TREF_ADDR of the outcast memory cell rows based on the outcast row list OCRL1 and may output the target refresh address TREF_ADDR based on the target refresh signal TREF.

The hammer refresh address generator 440 may provide the hammer refresh address HREF_ADDR and the target refresh address TREF_ADDR as the refresh row address REF_ADDR to the row address multiplexer 240 in FIG. 11.

Figure 14:
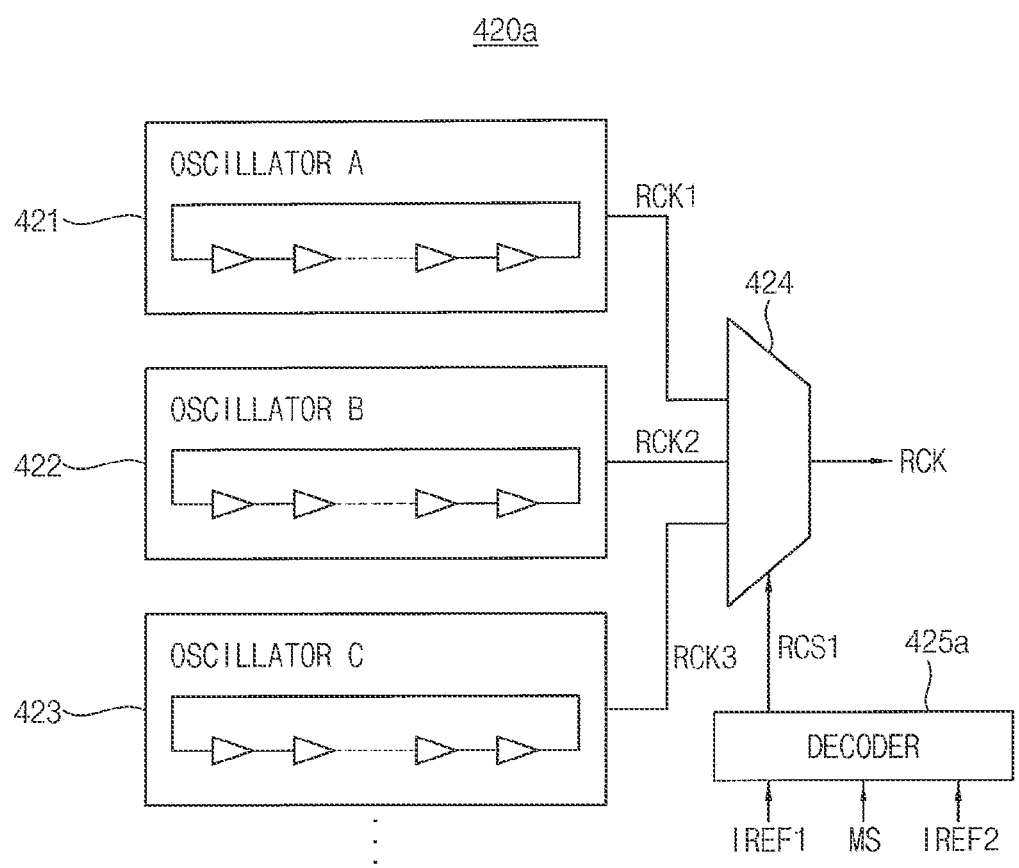
FIG. 14 is a circuit diagram illustrating an example of the refresh clock generator in FIG. 13 according to example embodiments.

FIG. 14 is a circuit diagram illustrating an example of the refresh clock generator in FIG. 13 according to example embodiments.

Referring to FIG. 14, a refresh clock generator 420a may include a plurality of oscillators 421, 422 and 423, a multiplexer 424 and a decoder 425a. The decoder 425a may decode the first refresh control signal IREF1, the second refresh control signal IREF2 and the mode signal MS to output a clock control signal RCS1. The oscillators 421, 422, and 423 generate refresh clock signals RCK1, RCK2 and RCK3 having different periods. The multiplexer 424 selects one of the refresh clock signals RCK1, RCK2 and RCK3 to provide the refresh clock signal RCK in response to the clock control signal RCS1.

Because the mode signal MS indicates that the hammer address is generated, the refresh clock generator 420a may adjust a refresh cycle by selecting one of the refresh clock signals RCK1, RCK2 and RCK3.

Figure 15:
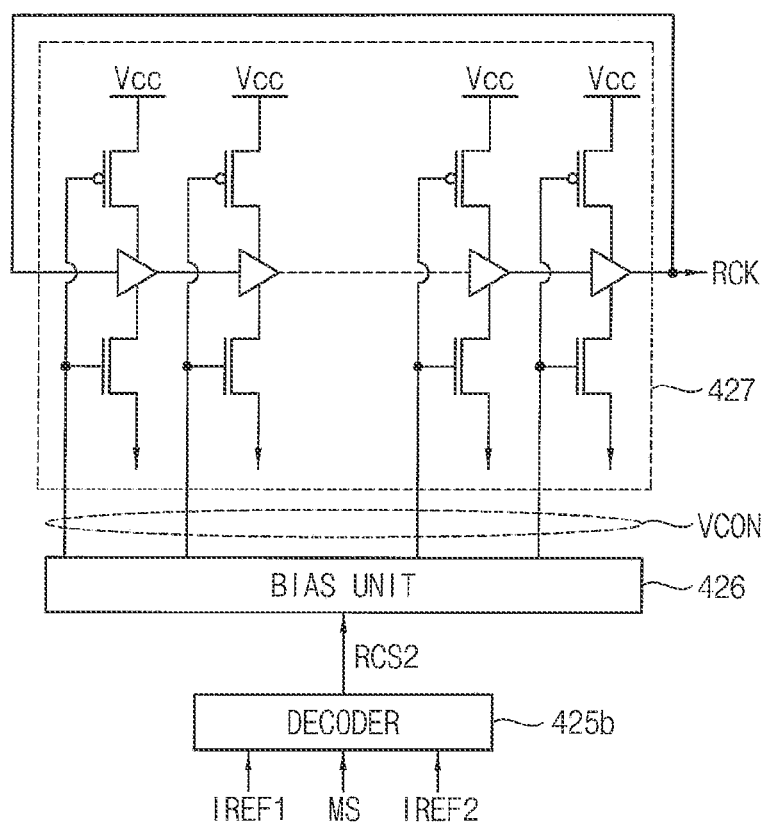
FIG. 15 is a circuit diagram illustrating another example of the refresh clock generator in FIG. 13 according to example embodiments.

FIG. 15 is a circuit diagram illustrating another example of the refresh clock generator in FIG. 13 according to example embodiments.

Referring to FIG. 15, a refresh clock generator 420b may include a decoder 425b, a bias unit 426 and an oscillator 427.

The decoder 425b may decode the first refresh control signal IREF1, the second refresh control signal IREF2, and the mode signal MS to output a clock control signal RCS2. The bias unit 426 generates a control voltage VCON in response to the clock control signal RCS2. The oscillator 427 generates the refresh clock signal RCK having a variable period, according to the control voltage VCON.

Because the mode signal MS indicates that the hammer address is generated, the refresh clock generator 420b may adjust a refresh cycle by varying a period of the refresh clock signal RCK based on the clock control signal RCS2.

Figure 16:
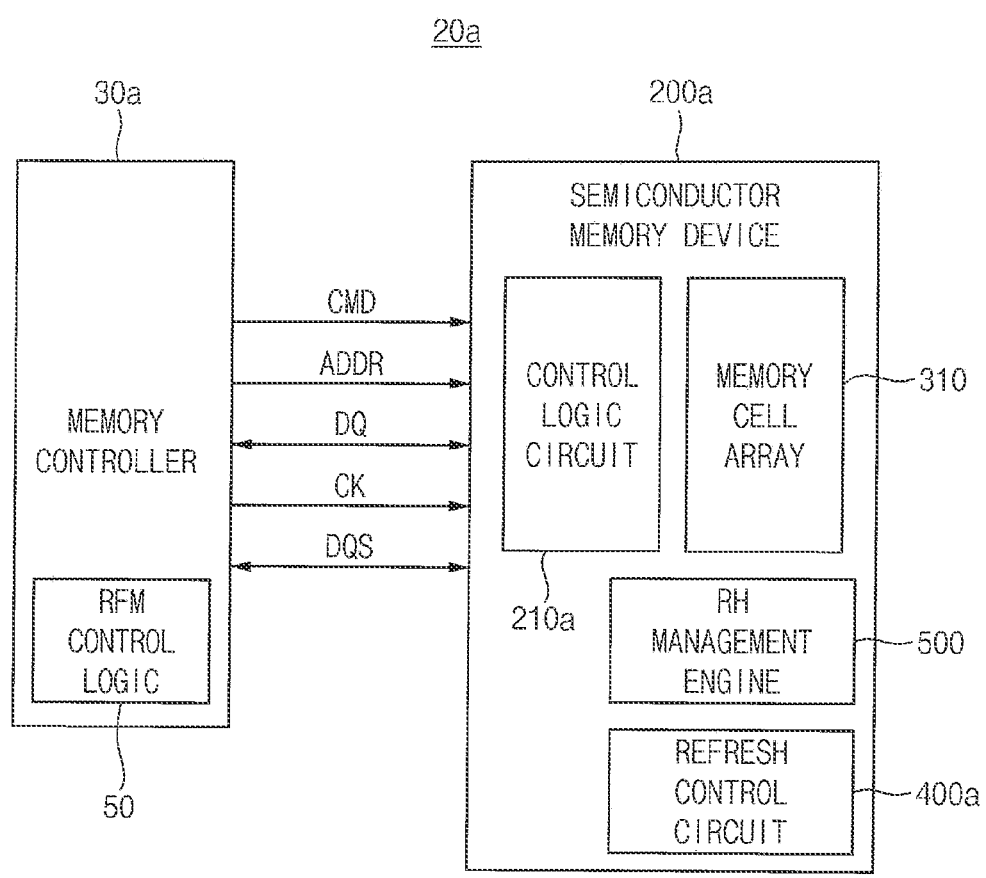
FIG. 16 is a block diagram illustrating a memory system according to example embodiments.

FIG. 16 is a block diagram illustrating a memory system according to example embodiments.

Referring to FIG. 16, a memory system 20a may include a memory controller 30a and a semiconductor memory device 200a.

The memory controller 30a may be similar with the memory controller 30 in FIG. 1 and the semiconductor memory device 200a may be similar with the semiconductor memory device 200 in FIG. 1.

The memory controller 30a may issue operation commands to the semiconductor memory device 200a for controlling the semiconductor memory device 200a.

The memory controller 30a may transmit a clock signal CK (the clock signal CK may be referred to a command clock signal), a command CMD, and an address (signal) ADDR to the semiconductor memory device 200a. The memory controller 30a may exchange a (data) strobe signal DQS with the semiconductor memory device 200a when the memory controller 30 transmits the data signal DQ to the semiconductor memory device 200a or receives the data signal DQ from the semiconductor memory device 200a. The address ADDR may be accompanied by the command CMD, and the address ADDR may be referred to as an access address.

The memory controller 30a may include an RFM control logic 50 that generates an RFM command associated with a row hammer of the plurality of memory cell rows.

The semiconductor memory device 200a includes a memory cell array 310 that stores the data signal DQ, a control logic circuit 210a, a refresh control circuit 400a, and a row hammer (RH) management engine 500.

The control logic circuit 210a may control operations of the semiconductor memory device 200a. The memory cell array 310 may include a plurality of memory cell rows and each of the memory cell rows may include a plurality of volatile memory cells.

The row hammer management engine 500 may predict a first probability of occurrence of a row hammer in which at least one of the plurality of memory cell rows is intensively accessed by a first row access pattern on at least a second portion on the plurality of memory cell rows during a first reference time interval posterior to a first refresh interval during which at least a first portion of the plurality of memory cell rows are refreshed, based on a machine learning, may generate a hammer address associated with the row hammer, may generate an outcast row list which is associated with outcast memory cell rows from among the plurality of memory cell rows, which are excluded from a hammer refresh operation for coping with the row hammer, may provide the hammer address and an alert signal indicating that the row hammer occurs, and may provide the hammer address, the alert signal, and the outcast row list to the refresh control circuit 400a.

The refresh control circuit 400a may perform a hammer refresh operation on one or more victim memory cell rows physically adjacent to a memory cell row corresponding to the hammer address based on the hammer address and may perform a target refresh operation on the outcast memory cell rows based on the outcast row list.

Figure 17:
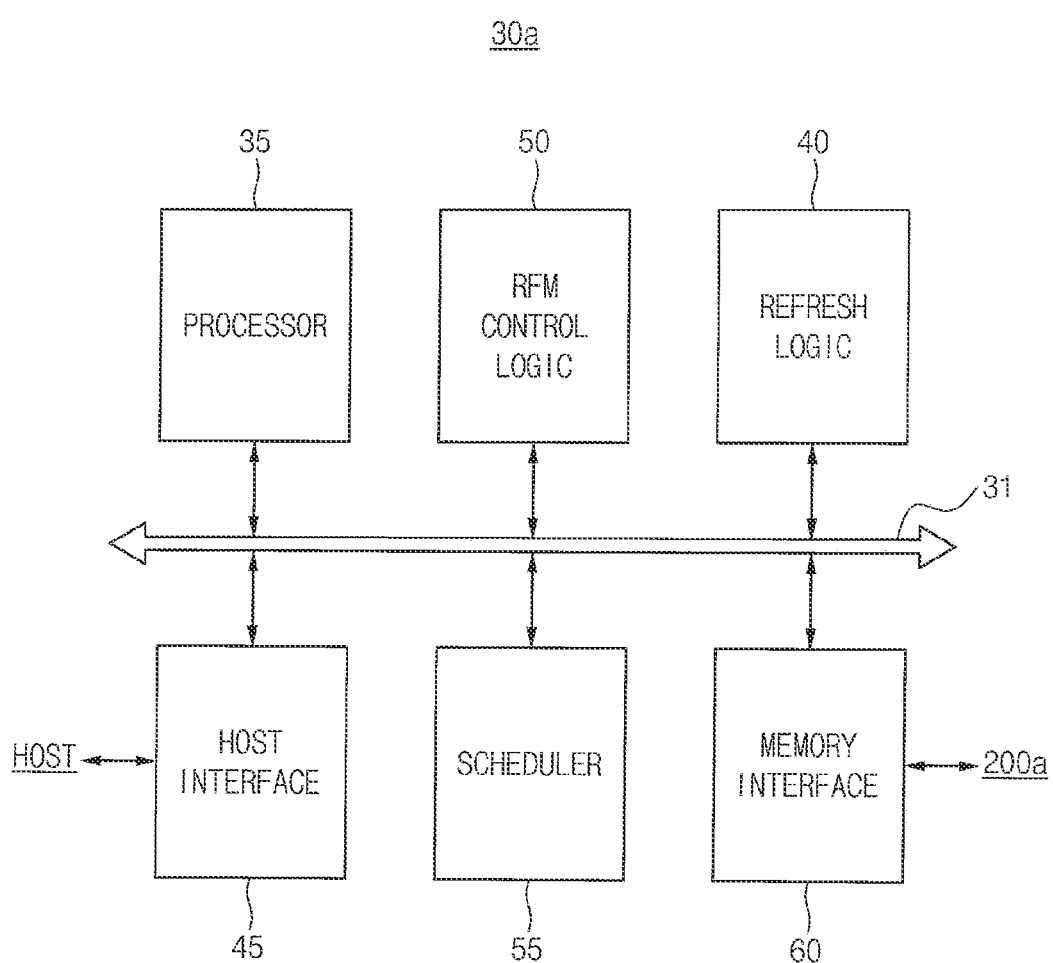
FIG. 17 is a block diagram illustrating the memory controller in FIG. 16 according to example embodiments.

FIG. 17 is a block diagram illustrating the memory controller in FIG. 16 according to example embodiments.

Referring to FIG. 17, a memory controller 30a may include a processor 35, the RFM control logic 50, a refresh logic 40, a host interface 45, a scheduler 55, and a memory interface 60 which are connected to each other through a bus 31.

The processor 35 may control overall operation of the memory controller 30a. The CPU 35 may control the RFM control logic 50, the refresh logic 40, the host interface 45, the scheduler 55, and the memory interface 60 through the bus 31.

The refresh logic 40 may generate an auto refresh command for refreshing memory cells of the plurality of memory cell rows based on a refresh period of the semiconductor memory device 200a.

The host interface 50 may perform interfacing with a host. The memory interface 60 may perform interfacing with the semiconductor memory device 200a.

The scheduler 55 may manage scheduling and transmission of sequences of commands generated in the memory controller 30a.

Figure 18:
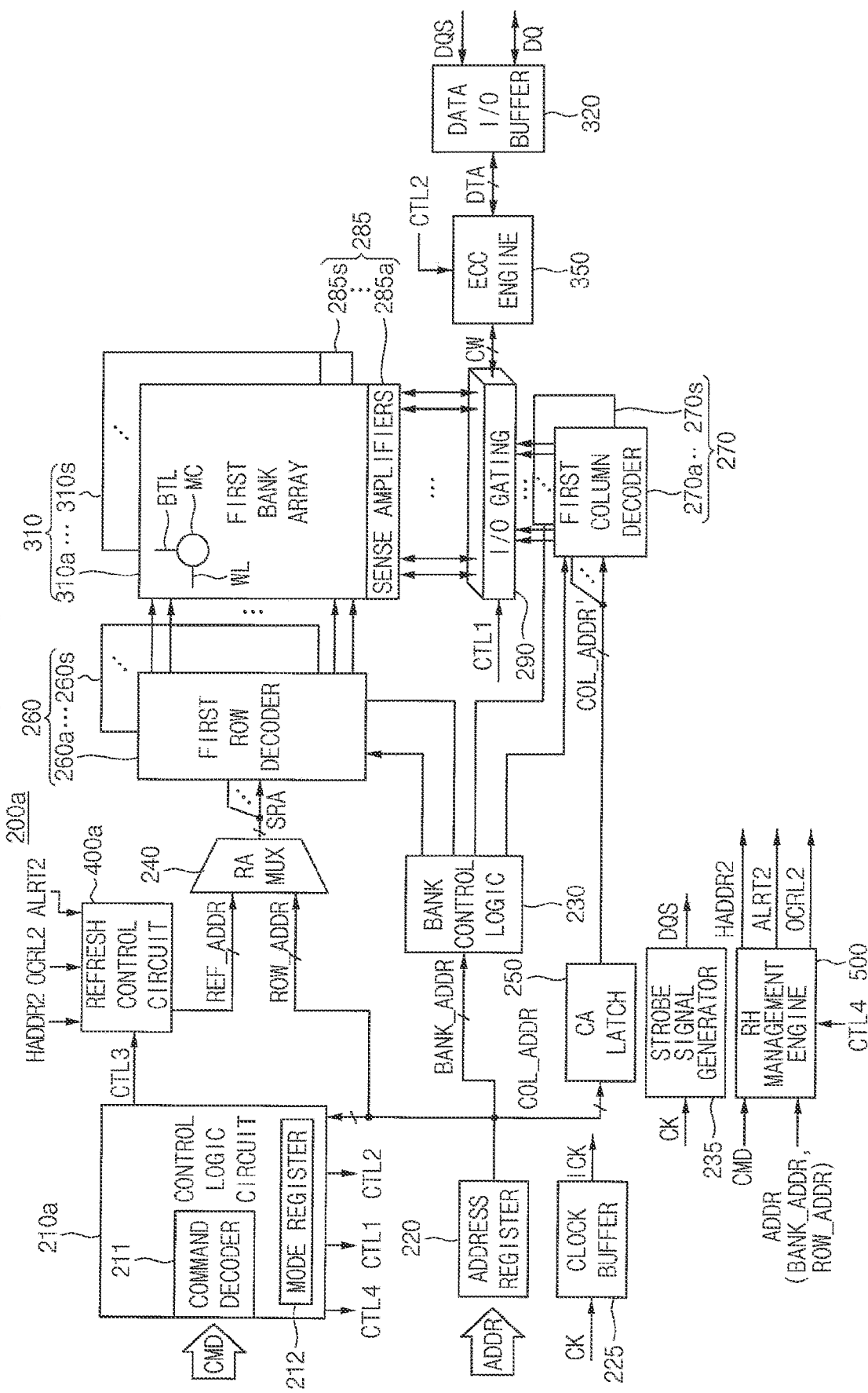
FIG. 18 is a block diagram illustrating an example of the semiconductor memory device in FIG. 16 according to example embodiments.

FIG. 18 is a block diagram illustrating an example of the semiconductor memory device in FIG. 16 according to example embodiments.

Referring to FIG. 18, the semiconductor memory device 200a may include the control logic circuit 210a, an address register 220, a bank control logic 230, a refresh control circuit 400a, a row address multiplexer 240, a column address latch 250, a row decoder 260, a column decoder 270, the memory cell array 310, a sense amplifier unit 285, an input/output (I/O) gating circuit 290, an error correction code (ECC) engine 350, a clock buffer 225, a strobe signal generator 235, the row hammer management engine 500 and a data I/O buffer 320.

The semiconductor memory device 200a differs from the semiconductor memory device 200 of FIG. 11 in configurations and/or operations of the control logic circuit 210a, the refresh control circuit 400a, and the row hammer management engine 500. The control logic circuit 210a, the refresh control circuit 400a, and the row hammer management engine 500 will be described, and descriptions repeated with FIG. 11 will be omitted.

The refresh control circuit 400a may sequentially increase or decrease the refresh row address REF_ADDR in a normal refresh mode in response to a third control signal CTL3 from the control logic circuit 210a. The refresh control circuit 400a may receive a hammer address HADDR2, an alert signal ALRT2 and an outcast row list OCRL2 from the row hammer management engine 500, may perform a hammer refresh operation on one or more victim memory cell rows based on the hammer address HADDR2, and may perform a target refresh operation on the outcast memory cell rows based on the outcast row list OCRL2. The refresh control circuit 400a may output hammer refresh addresses designating the one or more victim memory cell rows physically adjacent to a memory cell row corresponding to the hammer address HADDR2 as the refresh row address REF_ADDR and may output target refresh addresses designating the outcast memory cell rows as the refresh row address REF_ADDR based on the outcast row list OCRL2.

The control logic circuit 210a may control operations of the semiconductor memory device 200a. For example, the control logic circuit 210a may generate control signals for the semiconductor memory device 200a in order to perform a write operation, a read operation, a normal refresh operation, and a hammer refresh operation. The control logic circuit 210a includes a command decoder 211 that decodes the command CMD received from the memory controller 30 and a mode register 212 that sets an operation mode of the semiconductor memory device 200a.

For example, the command decoder 211 may generate the control signals corresponding to the command CMD by decoding a write enable signal, a row address strobe signal, a column address strobe signal, a chip select signal, etc. The control logic circuit 210a may provide a first control signal CTL1 to the I/O gating circuit, the second control signal CTL2 to control the ECC engine 350, the third control signal CTL3 to control the refresh control circuit 400, and a fourth control signal CTL4 to control the row hammer management engine 500.

The row hammer management engine 500 may receive the address ADDR (including the bank address BANK_ADDR and the row address ROW_ADDR) and the command CMD, may predict a first probability of occurrence of a row hammer in which at least one of the plurality of memory cell rows is intensively accessed by a first row access pattern on at least a second portion of the plurality of memory cell rows during a first reference time interval posterior to a first refresh interval during which at least a first portion of the plurality of memory cell rows are refreshed, based on a machine learning, may generate the hammer address HADDR2 associated with the row hammer, may generate the outcast row list OCRL2 and the alert signal ALRT2, and may provide the hammer address HADDR2, the alert signal ALRT2, and the outcast row list OCRL2 to the refresh control circuit 400a.

Figure 19:
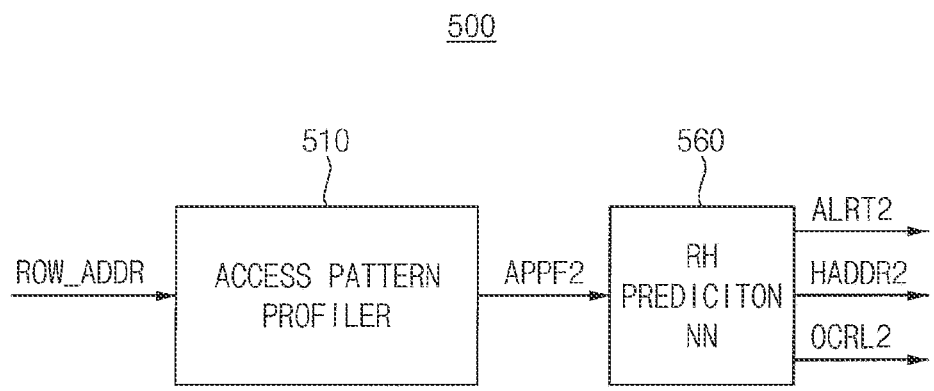
FIG. 19 is a block diagram illustrating an example of the row hammer management engine in the semiconductor memory device of FIG. 18 according to example embodiments.

FIG. 19 is a block diagram illustrating an example of the row hammer management engine in the semiconductor memory device of FIG. 18 according to example embodiments.

Referring to FIG. 19, the row hammer management engine 500 may include an access pattern profiler 510 and a row hammer prediction neural network 560.

The access pattern profiler 510 may generate an access pattern profile APPF2 based on a row access pattern associated with a first access on at least a second portion of a plurality of memory cell rows in the memory cell array 310 during a reference time interval posterior to a refresh interval during which at least a first portion of the plurality of memory cell rows are refreshed.

The row hammer prediction neural network 560 may perform machine learning based on learning data, may predict a probability of occurrence of a row hammer in which at least one of the plurality of memory cell rows is intensively accessed by the row access pattern, based on the access pattern profile APPF2, in response to the first probability being equal to or greater than a reference value, may generate the hammer address HADDR2 associated with the row hammer, the outcast row list OCRL2, and the alert signal ALRT2.

Descriptions with reference to FIGS. 3 through 10C may be applicable to the access pattern profiler 510 and the row hammer prediction neural network 560.

Therefore, the access pattern profiler 510 may include an aggressor row classification module, a similarity calculation module, a distribution generation module, a raw access pattern sampling module, and a profile generator. The row hammer prediction neural network may include a neural network and a decision logic.

Figure 20:
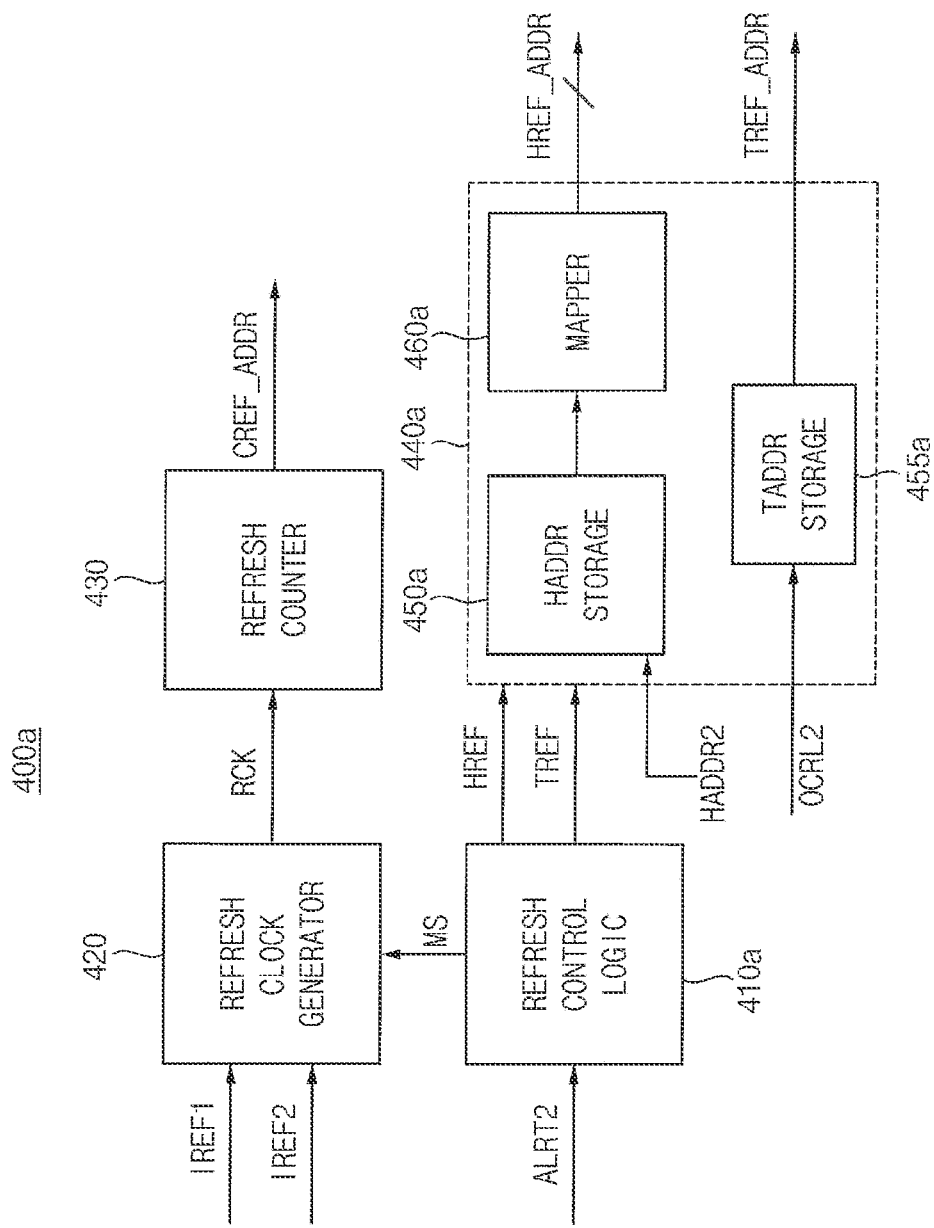
FIG. 20 is a block diagram illustrating an example of the refresh control circuit in FIG. 18 according to example embodiments.

FIG. 20 is a block diagram illustrating an example of the refresh control circuit in FIG. 18 according to example embodiments.

Referring to FIG. 20, the refresh control circuit 400a may include a refresh control logic 410a, a refresh clock generator 420, a refresh counter 430, and a hammer refresh address generator 440a.

The refresh control logic 410a may provide a mode signal MS in response to the alert signal ALRT2. In addition, the refresh control logic 410a may provide the hammer refresh address generator 440 with a hammer refresh signal HREF and a target refresh signal TREF.

The refresh clock generator 420 may generate a refresh clock signal RCK indicating a timing of a normal refresh operation based on a first refresh control signal IREF1, a second refresh control signal IREF2, and the mode signal MS. The refresh clock generator 420 may generate the refresh clock signal RCK in response to receiving the first refresh control signal IREF1 or while the second refresh control signal IREF2 is activated.

The refresh counter 430 may generate a counter refresh address CREF_ADDR designating sequentially the memory cell rows by performing a counting operation at the period of the refresh clock signal RCK and may provide the counter refresh address CREF_ADDR as the refresh row address REF_ADDR to the row address multiplexer 240 in FIG. 18.

The hammer refresh address generator 440a may include a hammer address storage 450a, a target address storage 455a and an mapper 460a.

The hammer address storage 450a may store the hammer address HADDR2 and may output the hammer address HADDR2 to the mapper 460a in response to the hammer refresh signal HREF. The mapper 460a may generate hammer refresh addresses HREF_ADDR designating one or more victim memory cell rows physically adjacent to a memory cell row corresponding to the hammer address HADDR2.

The target address storage 455a may receive the outcast row list OCRL2, may store target refresh address TREF_ADDR of the outcast memory cell rows based on the outcast row list OCRL2, and may output the target refresh address TREF_ADDR based on the target refresh signal TREF.

The hammer refresh address generator 440a may provide the hammer refresh address HREF_ADDR and the target refresh address TREF_ADDR as the refresh row address REF_ADDR to the row address multiplexer 240 in FIG. 18.

FIGS. 21 and 22 illustrate example commands which may be used in the memory system of FIG. 1 or the memory system of FIG. 16.

FIG. 21 illustrates combinations of a chip selection signal CS_n and first through fourteenth command-address signals CA0~CA13 representing an active command ACT, a write command WR and a read command RD, and FIG. 22 illustrates combinations of the chip selection signal CS_n and the first through fourteenth command-address signals CA0~CA13 representing precharge commands PREab, PREsb and PREpb.

In FIGS. 21 and 22, H indicates the logic high level, L indicates the logic low level, V indicates a valid logic level corresponding to one of the logic high level and the logic low level, R0~R17 indicate bits of a row address, BA0 through BA2 indicate bits of a bank address, and CID0 through CID3 indicate a die identifier of a memory die when the semiconductor memory device 200 is implemented with a stacked memory device including a plurality of memory dies. In addition, in FIG. 21, C2~C10 indicate bits of a column address and BL indicates a burst length flag.

Referring to FIG. 21, the active command ACT, the write command WR and the read command RD may be transferred during two cycles, for example, during a high level and a low level of the chip selection signal CS_n. The active command ACT may include the bank address bits BA0 and BA1 and the row address bits R0~R17.

In FIG. 22, PREpb is a precharge command to precharge a particular bank in a particular bank group, PREab is an all bank precharge command to precharge all banks in all bank groups, and PREsb is a same bank precharge command to precharge the same bank in all bank groups.

Referring to FIG. 22, the ninth command-address signal CA8 or the tenth command-address signal CA9 of each of the precharge commands PREab and PREsb may be used as a flag to notify the hammer address.

Figure 23:
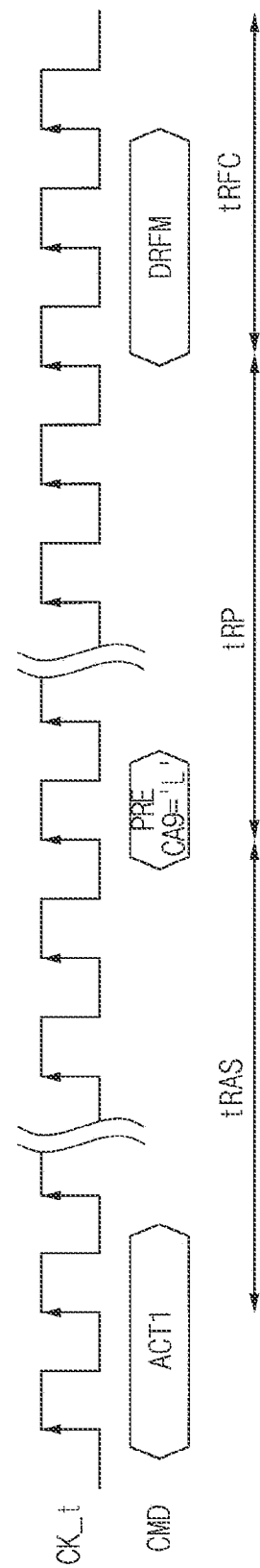
FIG. 23 illustrates an example of the command protocol of the memory system when the memory system determines a hammer address based on the precharge command.

FIG. 23 illustrates an example of the command protocol of the memory system when the memory system determines a hammer address based on the precharge command.

Referring to FIGS. 16, 17, 18 and 23, the scheduler 55 applies the first active command ACT1 to the semiconductor memory device 200 in synchronization with an edge of the clock signal CK_t and applies the precharge command PRE designating whether a target memory cell row designated by a target row address corresponds to a hammer address, which is accompanied by the first active command ACT1, to the semiconductor memory device 200 after a time tRAS (corresponding to an active to precharge time) elapses. In some example embodiments, the scheduler 55 may set the tenth command-address signal CA9 of the precharge command PRE to a logic low level.

After a time interval corresponding to precharge time tRP, the scheduler 55 applies a second active command ACT2 to the semiconductor memory device 200 in synchronization with an edge of the clock signal CK_t and applies a direct refresh management command DRFM to the semiconductor memory device 200. The semiconductor memory device 200 performs a hammer refresh operation on one or more victim memory cell rows physically adjacent to a memory cell row corresponding to the hammer address HADDR during a refresh cycle tRFC, in response to the direct refresh management command DRFM. During the refresh cycle interval tRFC, generating other commands is inhibited from a time point of the semiconductor memory device 200 receiving the direct refresh management command DRFM.

Figure 24:
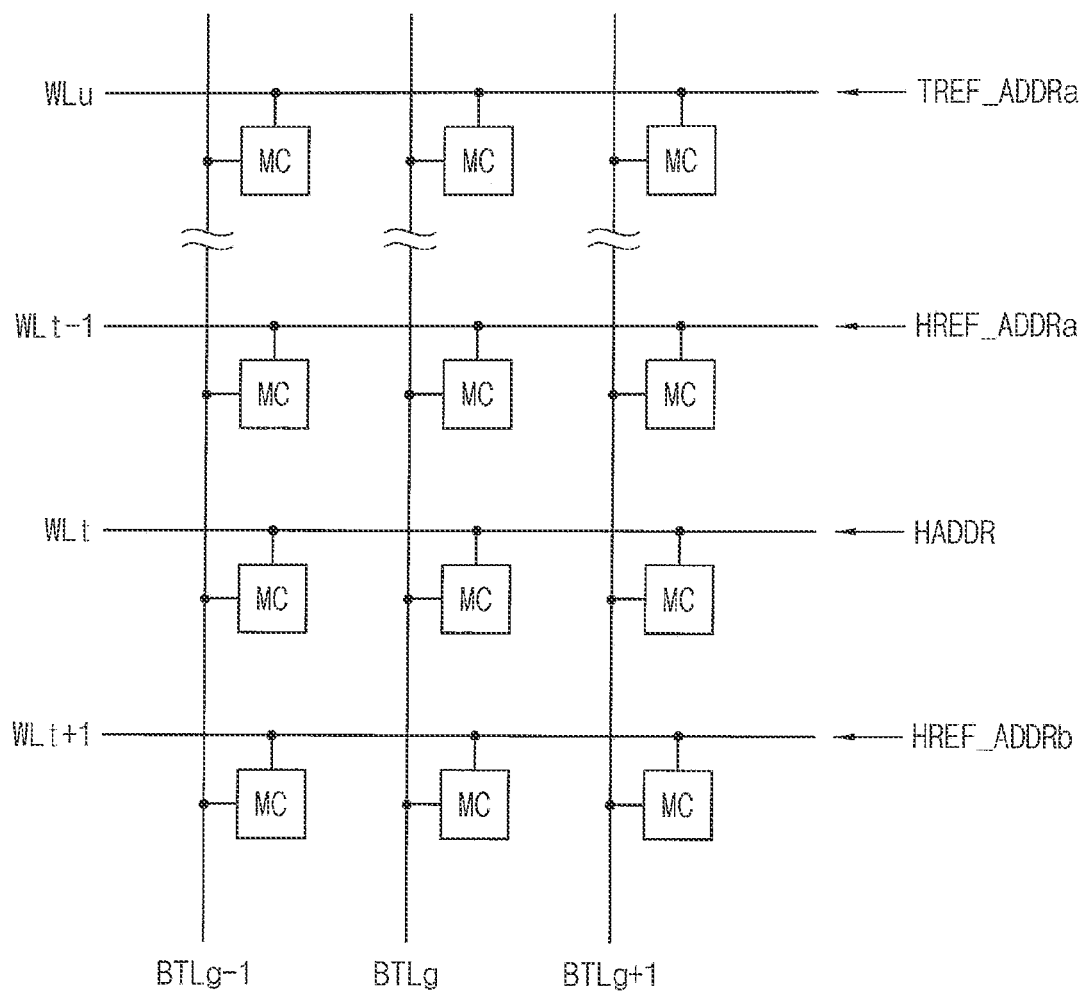
FIG. 24 is a diagram illustrating a portion of a memory cell array for describing generation of hammer refresh addresses.

FIG. 24 is a diagram illustrating a portion of a memory cell array for describing generation of hammer refresh addresses.

FIG. 24 illustrates four word-lines WLt−1, WLt, WLt+1 and WLu, three bit-lines BTLg−1, BTLg and BTLg+1, and memory cells MC coupled to the word-lines WLt−1, WLt, WLt+1 and WLu and the bit-lines BTLg−1, BTLg and BTLg+1 in the memory cell array. The four word-lines WLt−1, WLt, WLt+1 and WLu are extended in a row direction (e.g., the first direction D1) and arranged sequentially along a column direction (e.g., the second direction D2). The three bit-lines BTLg−1, BTLg and BTLg+1 are extended in the column direction and arranged sequentially along the row direction. It will be understood that the word-lines WLt−1 and WLt are physically directly adjacent to each other since there are no intervening word-lines between the word-lines WLt−1 and WLt.

For example, the middle word-line WLt may correspond to the hammer address HADDR that has been intensively accessed. It will be understood that "an intensively-accessed word-line" refers to a word-line that has a relatively higher number of activations and/or has a relatively higher activation frequency. Whenever the hammer word-line (e.g., the middle word-line WLt) is accessed, the hammer word-line WLt is enabled and precharged and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 are affected. As the hammer word-line WLt is accessed more frequently, the cell charges of the memory cells MC coupled to the adjacent word-lines WLt−1 and WLt+1 may be lost more rapidly.

The hammer address generator 440 in FIG. 13 or the hammer address generator 440a in FIG. 20 may provide the hammer refresh address HREF_ADDR representing the addresses HREF_ADDRa and HREF_ADDRb of the rows (e.g., the word-lines WLt−1 and WLt+1) that are physically adjacent to the row of the hammer address HADDR (e.g., the middle word-line WLt), and a refresh operation for the adjacent word-lines WLt−1 and WLt+1 may be performed additionally based on (e.g., in response to) the hammer refresh address HREF_ADDR to reduce or possibly prevent the loss of data stored in the memory cells MC. In addition, the hammer address generator 440 in FIG. 13 or the hammer address generator 440a in FIG. 20 may provide a target refresh address TREF_ADDRa designating an outcast memory cell row coupled to the word-line WLu, which is not adjacent to the word-line WLt but has a high probability of row hammer occurring and perform a target refresh operation on the outcast memory cell row coupled to the word-line WLu, thus preventing loss of data stored in memory cells excluded from the hammer refresh operation.

Figure 25:
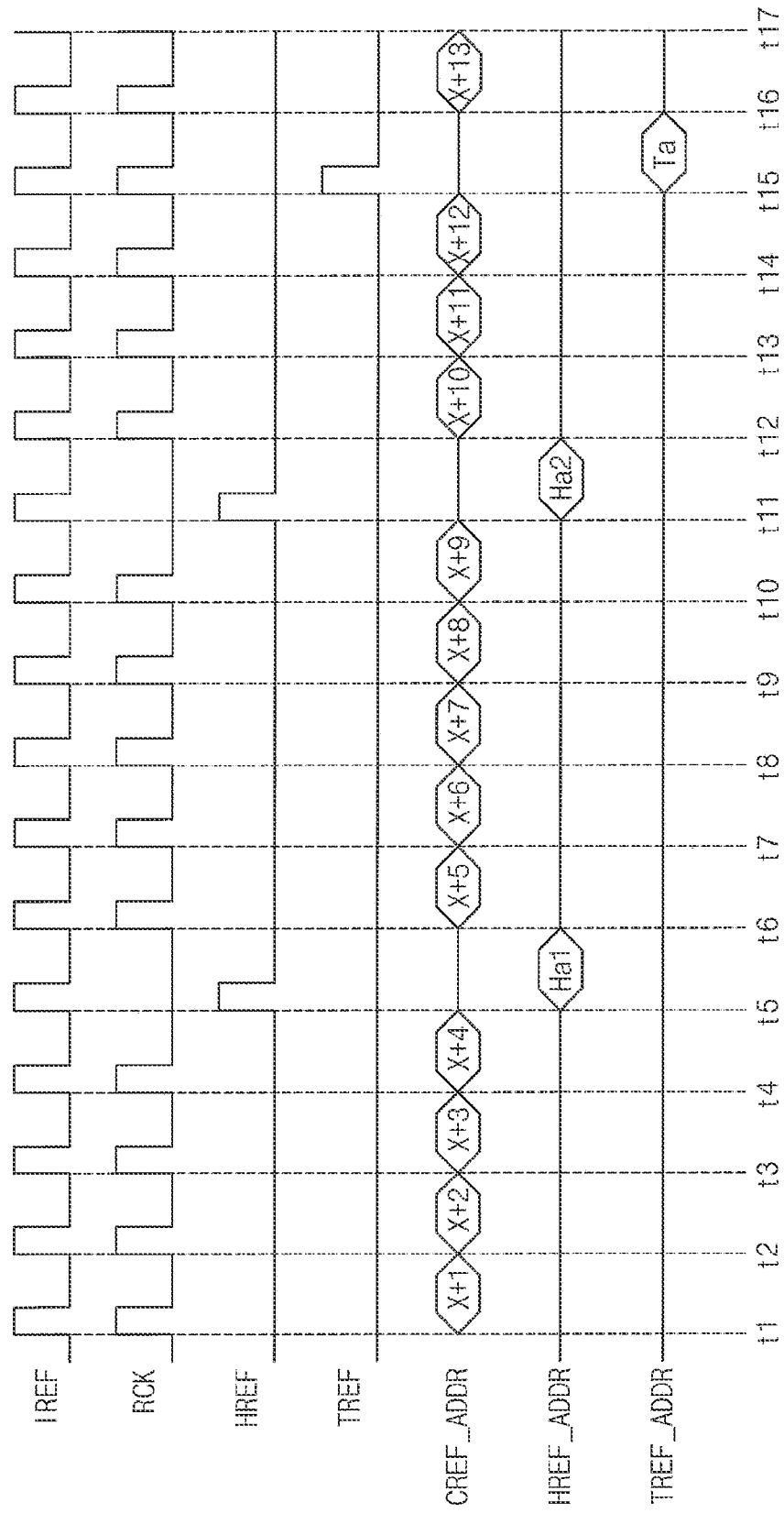
FIGS. 25 and 26 are timing diagrams illustrating example operations of a refresh control circuit of FIG. 13 or the refresh control circuit of FIG. 20 according to example embodiments.
Figure 26:
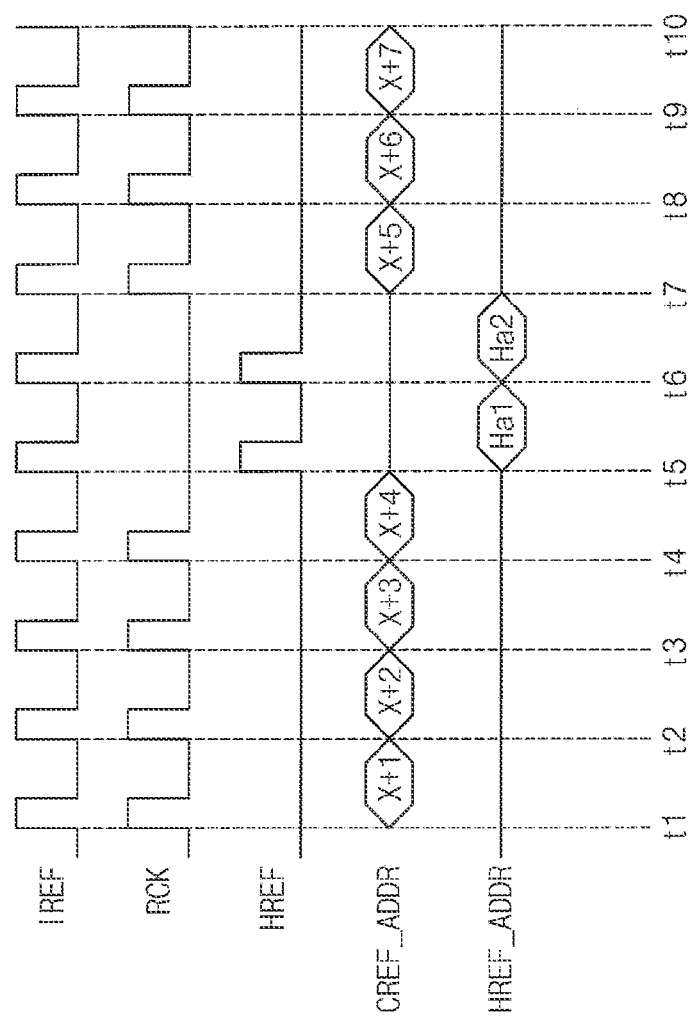

FIGS. 25 and 26 are timing diagrams illustrating example operations of a refresh control circuit of FIG. 13 or the refresh control circuit of FIG. 20 according to example embodiments.

FIGS. 25 and 26 illustrate generations of a refresh clock signal RCK, a hammer refresh signal HREF, a target refresh signal TREF, a counter refresh address CREF_ADDR, a hammer refresh address HREF_ADDR, and a target refresh address TREF_ADDR with respect to a refresh control signal IREF that is activated in a pulse shape. The intervals between the activation time points t1~t17 or between the activation time points t1~t10 of the refresh control signal IREF may be regular or irregular.

Referring to FIGS. 13, 20 and 25, the refresh control logic 410 or 410a may activate the refresh clock signal RCK in synchronization with some time points t1~t4, t6~t10 and t12~t17 among the activation time points t1~t17 of the refresh control signal IREF, may activate the hammer refresh signal HREF with the other time points t5 and 01, and may active the target refresh signal TREF with the time point t15.

The refresh counter 430 or 430a may generate the counter refresh address CREF_ADDR representing the sequentially changing addresses X+1~X+13 in synchronization with the activation time points t1~t4, t6~t10, t12~t14 and t16 of the refresh clock signal RCK. The hammer refresh address generator 440 or 440a may generate the hammer refresh address HREF_ADDR representing the address Ha1 and Ha2 of the rows that are physically adjacent to the row of the hammer address in synchronization with the activation time points t5 and t11 of the hammer refresh signal HREF and may generate the target refresh address TREF_ADDR representing the address Ta corresponding to the outcast memory cell row in synchronization with the activation time point t15 of the target refresh signal TREF.

Referring to FIGS. 13, 20 and 26, the refresh control logic 410 or 410a may activate the refresh clock signal RCK in synchronization with some time points t1~t4 and t7~t10 among the activation time points t1~t10 of the refresh control signal IREF and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t9 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Figure 27:
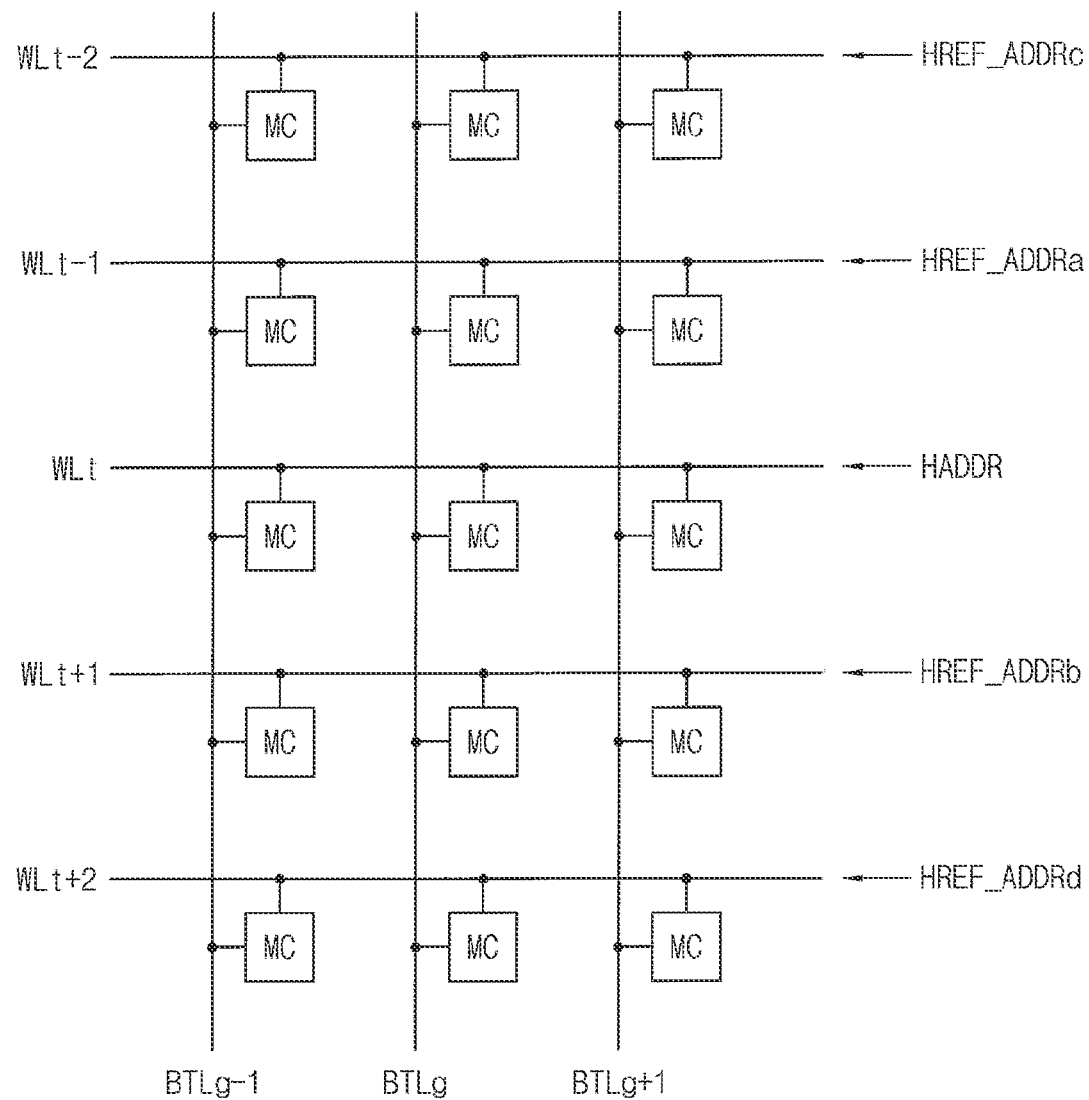
FIG. 27 is a diagram illustrating a portion of a memory cell array for describing generation of hammer refresh addresses.

FIG. 27 is a diagram illustrating a portion of a memory cell array for describing the generation of hammer refresh addresses.

FIG. 27 illustrates five word-lines WLt−2 WLt−1, WLt, WLt+1 and WLt+2, three bit-lines BTLg−1, BTLg and BTLg+1 and memory cells MC coupled to the word-lines WLt−2 WLt−1, WLt, WLt+1 and WLt+2 and the bit-lines BTLg−1, BTLg and BTLg+1 in the memory cell array. The five word-lines WLt−2 WLt−1, WLt, WLt+1 and WLt+2 are extended in a row direction and arranged sequentially along a column direction.

The hammer address generator 440 in FIG. 13 or the hammer address generator 440a in FIG. 20 may provide the HREF_ADDR representing addresses HREF_ADDRa, HREF_ADDRb, HREF_ADDRc and HREF_ADDRd of the rows (e.g., the word-lines WLt−2 WLt−1, WLt+1 and WLt+ 1) that are physically adjacent to the row of the hammer address HADDR (e.g., the middle word-line WLt), and a refresh operation for the adjacent word-lines WLt−2 WLt−1, WLt+1 and WLt+1 may be performed additionally based on (e.g., in response to) the hammer refresh address HREF_ADDR to reduce or possibly prevent the loss of data stored in the memory cells MC.

Figure 28:
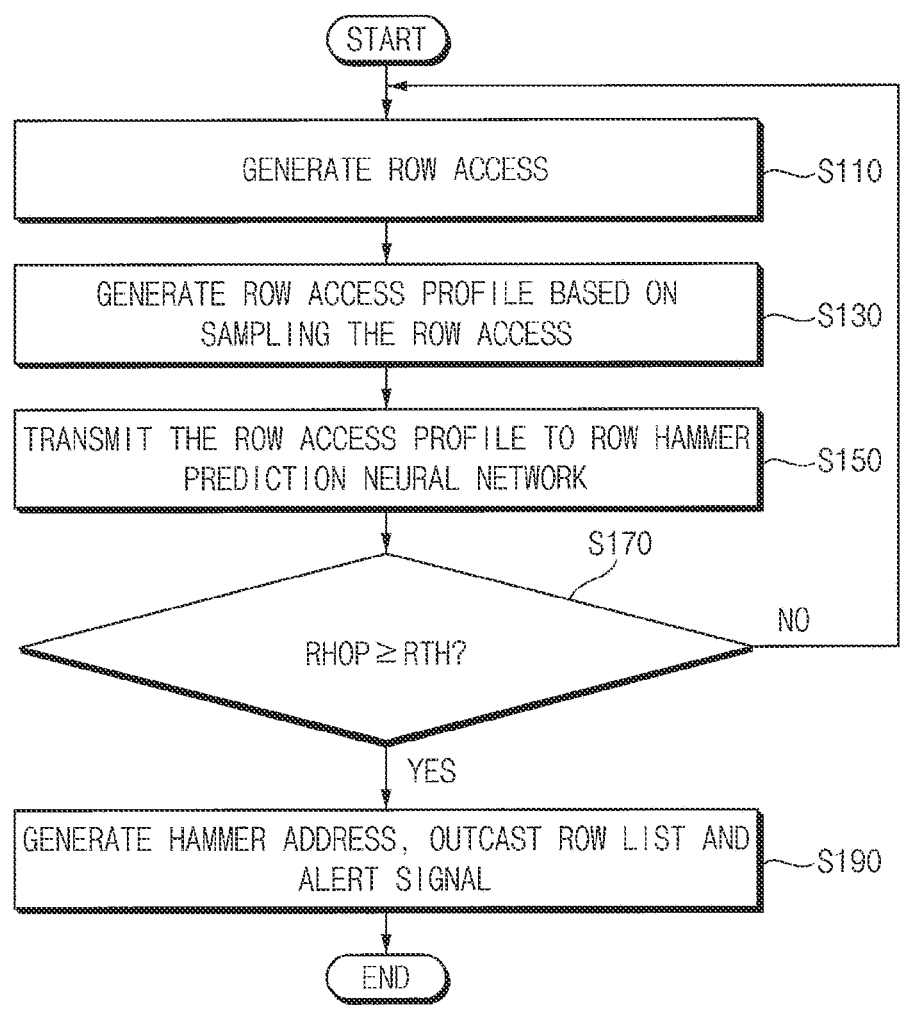
FIG. 28 is a flow chart illustrating an operation of the memory controller of FIG. 2 according to example embodiments.

FIG. 28 is a flow chart illustrating an operation of the memory controller of FIG. 2 according to example embodiments.

Referring to FIGS. 1 through 10C and 28, the scheduler 55 in the memory controller 30 generates a row access including a plurality of row addresses for accessing memory cell rows of the semiconductor memory device (operation S110).

The access pattern profiler 110 generates the access pattern profile APPF1 based on a row access pattern associated with accesses on the plurality of memory cell rows of the semiconductor memory device 200 during a reference time interval posterior to a refresh interval during which the plurality of memory cell rows are refreshed (operation S130).

The access pattern profiler 110 provides the access pattern profile APPF1 to the row hammer prediction neural network 160 (operation S150).

The row hammer prediction neural network 160 predicts a probability RHOP1 of occurrence of a row hammer in which at least one of the plurality of memory cell rows is intensively accessed by the row access pattern, based on the access pattern profile APPF1, and determines whether the probability RHOP1 is equal to or greater than a reference value RTH (operation S170).

When the probability RHOP1 is smaller than the reference value RTH (NO in S170), the process may return to the operation S110.

When the probability RHOP1 is equal to or greater than the reference value RTH (YES in operation S170), the row hammer prediction neural network 160 generates the hammer address HADDR1 associated with the row hammer, the outcast row list OCRL1, and the alert signal ALRT1 based on the access pattern profile APPF1 (operation S190) and transmits the hammer address HADDR1, the outcast row list OCRL1, and the alert signal ALRT1 to the semiconductor memory device.

Operations of FIG. 28 may be applicable to the row hammer management engine 500 in the semiconductor memory device in FIG. 16.

Accordingly, the memory controller and the semiconductor memory device according to example embodiments, may generate an access pattern profile based on an access pattern during a reference time interval, may predict a probability of occurrence of a row hammer based on the access pattern profile and based on machine learning, may generate a hammer address, an outcast row list and an alert signal in response to the probability being equal to or greater than a reference value, may perform a hammer refresh operation on one or victim memory cell rows physically adjacent a memory cell row corresponding to the hammer address, and may perform a target refresh operation on outcast memory cell rows based on the outcast row list. Therefore, the memory controller and the semiconductor memory device may cope with a malicious access pattern whether known or unknown.

Figure 29:
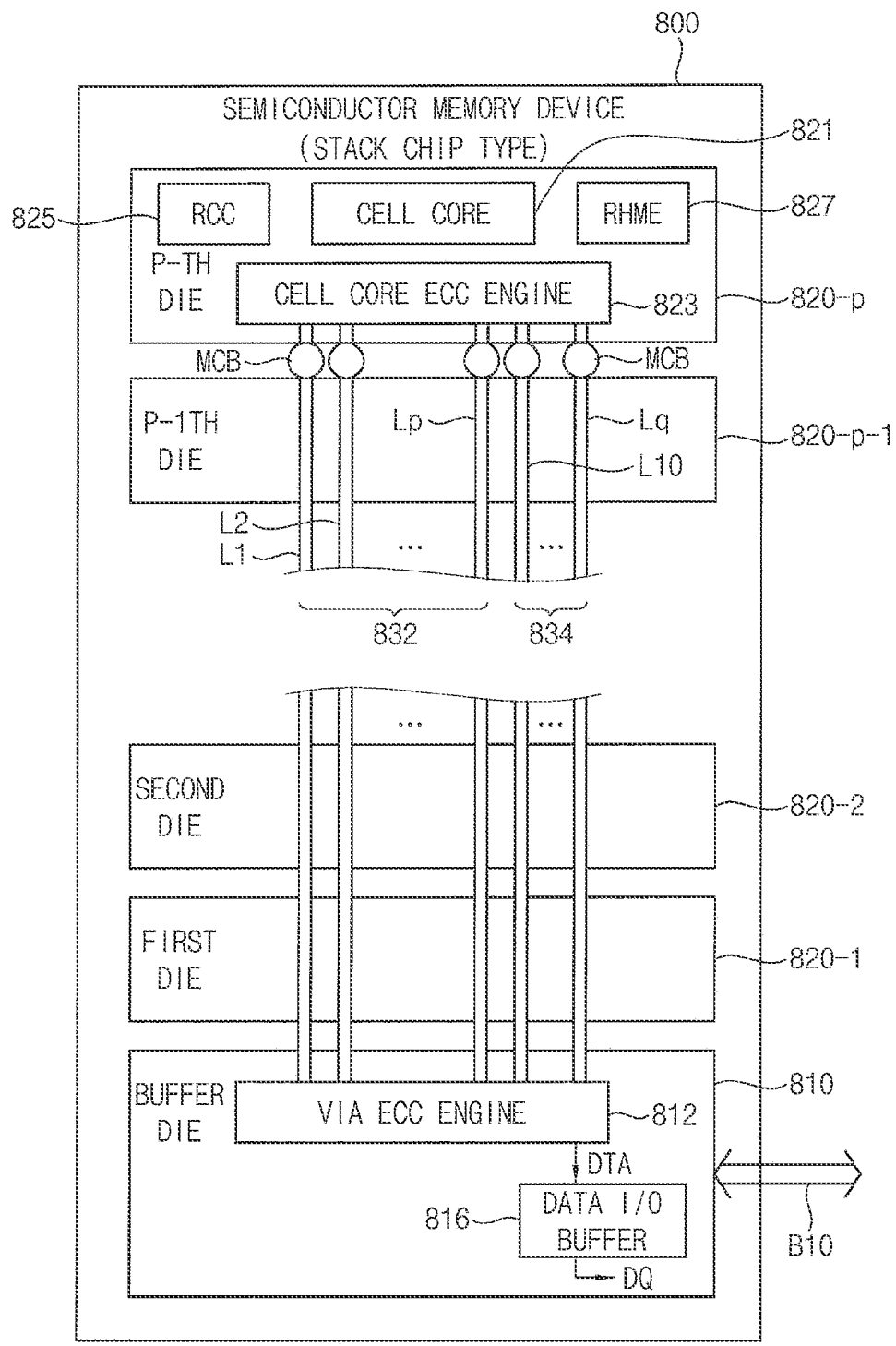
FIG. 29 is a block diagram illustrating a semiconductor memory device according to example embodiments.

FIG. 29 is a block diagram illustrating a semiconductor memory device according to example embodiments.

Referring to FIG. 29, a semiconductor memory device 800 may include at least one buffer die 810 and a plurality of memory dies 820-1 to 820-p (p is a natural number equal to or greater than three) providing a soft error analyzing and correcting function in a stacked chip structure.

The plurality of memory dies 820-1 to 820-p are stacked on the buffer die 810 and conveys data through a plurality of through silicon via (TSV) lines.

Each of the plurality of memory dies 820-1 to 820-p may include a cell core 821 to store data, a cell core ECC engine 823 which generates transmission parity bits (i.e., transmission parity data) based on transmission data to be sent to the at least one buffer die 810, a refresh control circuit (RCC) 825, and a row hammer management engine (RHME) 827. The cell core 821 may include a plurality of memory cells having a DRAM cell structure.

The refresh control circuit 825 may employ the refresh control circuit 400a of FIG. 20, and the row hammer management engine 827 may employ the row hammer management circuit 500 of FIG. 19. Therefore, the row hammer management engine 827 may predict a probability of occurrence of a row hammer in which at least one of a plurality of memory cell rows in the cell core 821 is intensively accessed by a row access pattern, may generate a hammer address associated with the row hammer, an outcast row list associated with outcast memory cell rows, which are excluded from a hammer refresh operation that is performed for coping with the row hammer, and an alert signal indicating that the row hammer occurs and may provide the hammer address, the alert signal, and the outcast row list to the refresh control circuit 825.

The buffer die 810 may include a via ECC engine 812 which corrects a transmission error using the transmission parity bits when a transmission error is detected from the transmission data received through the TSV lines and generates error-corrected data.

The buffer die 810 may further include and a data I/O buffer 816. The data I/O buffer 816 may generate the data signal DQ by sampling the data DTA from the via ECC engine 812 and may output the data signal DQ outside.

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-$p$ before the transmission data is sent.

A data TSV line group 832 which is formed at one memory die 820-$p$ may include 128 TSV lines L1 to Lp, and a parity TSV line group 834 may include 8 TSV lines L10 to Lq. The TSV lines L1 to Lp of the data TSV line group 832 and the parity TSV lines L10 to Lq of the parity TSV line group 834 may be connected to micro bumps MCB which are correspondingly formed among the memory dies 820-1 to 820-$p$.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 29, the cell core ECC engine 823 may be included in the memory die and the via ECC engine 812 may be included in the buffer die. Accordingly, it may be possible to detect and correct a soft data fail. The soft data fail may include a transmission error which is generated due to noise when data is transmitted through TSV lines.

Figure 30:
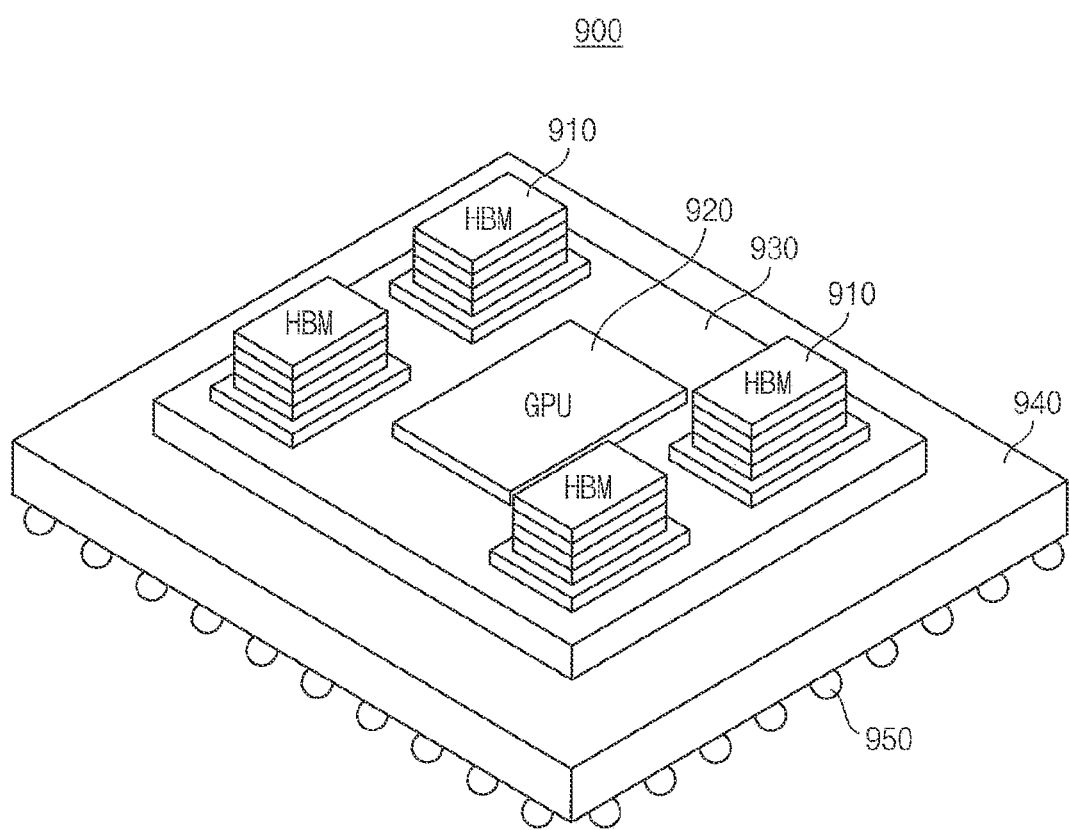
FIG. 30 is a configuration diagram illustrating a semiconductor package including the stacked memory device according to example embodiments.

FIG. 30 is a configuration diagram illustrating a semiconductor package including the stacked memory device according to example embodiments.

Referring to FIG. 30, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP). The GPU 920 may include a memory controller having a scheduler.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies may include a refresh control circuit and a row hammer management engine.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under package substrate 940 and the direct access region.

Aspects of example embodiments may be applied to systems using semiconductor memory devices that employ volatile memory cells and data clock signals. For example, aspects of example embodiments may be applied to systems such as a smart phone, a navigation system, a notebook computer, a desk top computer, and a game console that use the semiconductor memory device as a working memory.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A memory controller configured to control a semiconductor memory device, the memory controller comprising:
    an access pattern profiler configured to generate a first access pattern profile based on a first row access pattern associated with a first access on at least a second portion of a plurality of memory cell rows of the semiconductor memory device during a first reference time interval posterior to a first refresh interval during which at least a first portion of the plurality of memory cell rows are refreshed;
    a row hammer prediction neural network configured to:
        perform machine learning based on learning data,
        predict a first probability of occurrence of a row hammer in which at least one of the plurality of memory cell rows is intensively accessed by the first row access pattern, based on the first access pattern profile, and
        in response to the first probability being equal to or greater than a reference value, generate a hammer address associated with the row hammer, an outcast row list, and an alert signal indicating that the row hammer occurs, the outcast row list being associated with outcast memory cell rows from among the plurality of memory cell rows, which are excluded from a hammer refresh operation that is performed in the semiconductor memory device in response to the first row access pattern; and
    a memory interface configured to transmit the hammer address, the outcast row list and the alert signal to the semiconductor memory device.

2. The memory controller of claim 1, wherein the access pattern profiler includes:
an aggressor row classification module configured to map first row addresses included in the first row access pattern to first aggressor row identifiers,
a similarity calculation module configured to generate a first counted value indicating a first similarity between first refresh row addresses and the first rows addresses, the first refresh row addresses from among refresh row addresses being frequently refreshed during the first refresh interval during which the refresh row addresses are refreshed,
a distribution generation module configured to generate a distribution of the number of accesses of each of the first aggressor row identifiers during the first reference time interval, and
a profile generator configured to generate the first access pattern profile based on the first aggressor row identifiers, the first similarity, and the distribution.

3. The memory controller of claim 2, wherein the similarity calculation module is configured to generate the first counted value by comparing each of the first refresh row addresses and each of the first row addresses.

4. The memory controller of claim 2, wherein the aggressor row classification module, the similarity calculation module, and the distribution generation module operate in parallel.

5. The memory controller of claim 2, further comprising a raw access pattern sampling module configured to sample a portion of the first row access pattern to provide a sampled raw access pattern to the profile generator.

6. The memory controller of claim 5, wherein the profile generator is configured to generate the first access pattern profile further based on the sampled raw access pattern.

7. The memory controller of claim 1, wherein in response to the first probability being smaller than the reference value:
the access pattern profiler is configured to generate a second access pattern profile based on a second row access pattern associated with a second access on the plurality of memory cell rows during a second reference time interval posterior to a second refresh interval different from the first refresh interval, and
the row hammer prediction neural network is configured to predict a second probability of occurrence of the row hammer based on the second access pattern profile.

8. The memory controller of claim 1, wherein the row hammer prediction neural network includes:
a neural network configured to perform the machine learning based on the learning data and configured to predict the first probability based on the first access pattern profile, and
a decision logic configured to compare the first probability with the reference value and configured to generate the hammer address, the outcast row list, and the alert signal based on the first access pattern profile, in response to the first probability being greater than the reference value.

9. The memory controller of claim 8, wherein the decision logic is configured to determine the hammer address and the outcast row list based on a distribution of the number of accesses of each of first aggressor row identifiers during the first reference time interval, included in the first access pattern profile, and a physical location of the plurality of memory cell rows.

10. The memory controller of claim 1, further comprising:
an on-chip memory; and
a processor configured to execute the access pattern profiler and the row hammer prediction neural network that are loaded onto the on-chip memory.

11. A semiconductor memory device comprising:
a memory cell array including a plurality of memory cell rows, each including a plurality of volatile memory cells;
a row hammer management engine configured to:
predict a first probability of occurrence of a row hammer in which at least one of the plurality of memory cell rows is intensively accessed by a first row access pattern on at least a second portion on the plurality of memory cell rows during a first reference time interval posterior to a first refresh interval during which at least a first portion of the plurality of memory cell rows are refreshed, based on machine learning, and
generate a hammer address associated with the row hammer, an outcast row list, and an alert signal indicating that the row hammer occurs, the outcast row list being associated with outcast memory cell rows from among the plurality of memory cell rows which are excluded from a hammer refresh operation for coping with the row hammer; and
a refresh control circuit configured to receive the hammer address, the alert signal and the outcast row list, configured to perform the hammer refresh operation on one or more victim memory cell rows which are physically adjacent to a memory cell row corresponding to the hammer address, and configured to perform a target refresh operation on the outcast memory cell rows based on the outcast row list.

12. The semiconductor memory device of claim 11, wherein the row hammer management engine includes:
an access pattern profiler configured to generate a first access pattern profile based on a first row access pattern associated with a first access on the at least second portion of the plurality of memory cell rows, and
a row hammer prediction neural network configured to:
perform the machine learning based on learning data;
predict the first probability of occurrence of the row hammer based on the first access pattern profile; and
in response to the first probability being greater than a reference value, generate the hammer address, the outcast row list, and the alert signal.

13. The semiconductor memory device of claim 12, wherein:
the access pattern profiler includes:
an aggressor row classification module configured to map first row addresses included in the first row access pattern to first aggressor row identifiers;
a similarity calculation module configured to generate a first counted value indicating a first similarity between first refresh row addresses and the first rows addresses, the first refresh row addresses from among refresh row addresses being frequently refreshed during the first refresh interval during which the refresh row addresses are refreshed;
a distribution generation module configured to generate a distribution of the number of accesses of each of the first aggressor row identifiers during the first reference time interval; and a profile generator configured to generate the first access pattern profile based on the first aggressor row identifiers, the first similarity, and the distribution, and the aggressor row classification module, the similarity calculation module, and the distribution generation module operate in parallel.

14. The semiconductor memory device of claim 13, wherein the similarity calculation module is configured to generate the first counted value by comparing each of the first refresh row addresses and each of the first row addresses.

15. The semiconductor memory device of claim 13, further comprising:
a raw access pattern sampling module configured to sample a portion of the first row access pattern to provide a sampled raw access pattern to the profile generator, wherein
the profile generator is configured to generate the first access pattern profile further based on the sampled raw access pattern.

16. The semiconductor memory device of claim 12, wherein in response to the first probability being smaller than the reference value:
the access pattern profiler is configured to generate a second access pattern profile based on a second row access pattern associated with a second access on the plurality of memory cell rows during a second reference time interval posterior to a second refresh interval different from the first refresh interval, and
the row hammer prediction neural network is configured to predict a second probability of occurrence of the row hammer based in the second access pattern profile.

17. The semiconductor memory device of claim 12, wherein the row hammer prediction neural network includes:
a neural network configured to perform the machine learning based on the learning data and configured to predict the first probability based on the first access pattern profile, and
a decision logic configured to compare the first probability with the reference value and configured to generate the hammer address, the outcast row list, and the alert signal based on the first access pattern profile, in response to the first probability being greater than the reference value.

18. The semiconductor memory device of claim 17, wherein the decision logic is configured to determine the hammer address and the outcast row list based on a distribution of the number of accesses of each of first aggressor row identifiers during the first reference time interval, included in the first access pattern profile, and a physical location of the plurality of memory cell rows.

19. The semiconductor memory device of claim 11, wherein the refresh control circuit includes:
a refresh control logic configured to generate a hammer refresh signal and a target refresh signal in response to the alert signal,
a refresh clock generator configured to generate a refresh clock signal in response to a refresh signal, a refresh counter configured to generate a count refresh address associated with a normal refresh operation on the plurality of memory cell rows,
a hammer address storage configured to store the hammer address and configured to output the hammer address in response to the hammer refresh signal,
a mapper configured to generate hammer refresh addresses designating addresses of the one or more victim memory cell rows based on the hammer address output from the hammer address storage, and
a target address storage configured to store the outcast row list and configured to output target refresh addresses indicating row addresses of the outcast memory cell rows in response to the target refresh signal.

20. A memory system comprising:
a semiconductor memory device including a memory cell array that includes a plurality of memory cell rows, each including a plurality of volatile memory cells; and
a memory controller configured to control the semiconductor memory device, wherein the memory controller includes:
an access pattern profiler configured to generate a first access pattern profile based on a first row access pattern associated with a first access on at least a second portion of the plurality of memory cell rows during a first reference time interval posterior to a first refresh interval during which at least a first portion of the plurality of memory cell rows are refreshed,
a row hammer prediction neural network configured to:
perform machine learning based on learning data;
predict a first probability of occurrence of a row hammer in which at least one of the plurality of memory cell rows is intensively accessed by the first row access pattern, based on the first access pattern profile; and
in response to the first probability being equal to or greater than a reference value, generate a hammer address associated with the row hammer, an outcast row list, and an alert signal indicating that the row hammer occurs, the outcast row list being associated with outcast memory cell rows from among the plurality of memory cell rows, which are excluded from a hammer refresh operation that is performed in the semiconductor memory device in response to the first row access pattern, and
a memory interface configured to transmit the hammer address, the outcast row list, and the alert signal to the semiconductor memory device, wherein:
the semiconductor memory device is configured to, in response to the alert signal:
perform the hammer refresh operation on one or more victim memory cell rows which are physically adjacent to a memory cell row corresponding to the hammer address; and
perform a target refresh operation on the outcast memory cell rows based on the outcast row list.

* * * * *